US012655026B2

(12) United States Patent
Kidambi et al.

(10) Patent No.: US 12,655,026 B2
(45) Date of Patent: Jun. 16, 2026

(54) FORMATION OF PORES IN ATOMICALLY THIN LAYERS

(71) Applicants: Massachusetts Institute of Technology, Cambridge, MA (US); King Fahd University of Petroleum & Minerals, Dhahran (SA)

(72) Inventors: Piran Kidambi, Somerville, MA (US); Ahmed Ibrahim, Dhahran (SA); Tahar Laoui, Dhahran (SA); Jing Kong, Winchester, MA (US); Rohit N. Karnik, Cambridge, MA (US); Sui Zhang, Kent Vale (SG)

(73) Assignees: Massachusetts Institute of Technology, Cambridge, MA (US); King Fahd University of Petroleum & Minerals, Dhahran (SA)

( * ) Notice: Subject to any disclaimer, the term of this patent is extended or adjusted under 35 U.S.C. 154(b) by 636 days.

(21) Appl. No.: 17/980,413

(22) Filed: Nov. 3, 2022

(65) Prior Publication Data

US 2023/0249974 A1 Aug. 10, 2023

Related U.S. Application Data

(63) Continuation of application No. 16/081,157, filed as application No. PCT/US2017/059984 on Nov. 3, 2017, now Pat. No. 11,524,898.

(Continued)

(51) Int. Cl.
*B32B 9/00* (2006.01)
*B01D 69/12* (2006.01)
(Continued)

(52) U.S. Cl.
CPC ............ *C01B 32/186* (2017.08); *B01D 69/12* (2013.01); *B01D 71/0211* (2022.08);
(Continued)

(58) Field of Classification Search
USPC ........................................................ 428/688
See application file for complete search history.

(56) References Cited

U.S. PATENT DOCUMENTS 5,540,957 A 7/1996 Ueda et al.
6,177,684 B1 1/2001 Sugiyama
(Continued)

FOREIGN PATENT DOCUMENTS

CN 102583337 A 7/2012
WO WO 2017/212039 A1 12/2017
WO WO 2018/111432 A1 6/2018

OTHER PUBLICATIONS

No Author Listed, spectrumlabs.com web page, http://www.spectrumlabs.com/dialysis/FloatALyzer.html. Lab Dialysis, Spectra/Por microFloat-A-Lyzer and Spectra/Por Float-A-Lyzer G2 product information. Feb. 20, 2015 webpage entry accessed through the Wayback Machine on Feb. 13, 2019. https:///web.archive.org/web/20150220122534/http://www.spectrumlabs.com/dialysis . . . 2 pages.
(Continued)

*Primary Examiner* — Daniel H Miller
(74) *Attorney, Agent, or Firm* — Wolf, Greenfield & Sacks, P.C.

(57) ABSTRACT

Atomically thin layers including pores, their method of manufacture, and their use are disclosed. In some embodiments, pores may be formed in an atomically thin layer by growing the atomically thin layer on exposed portions of a substrate that includes islands comprising a material that is different than the material of the substrate. In some embodiments, pores and/or defects may be formed in an atomically
(Continued)

thin layer by employing growth conditions that promote the formation of defects and/or pores. In certain embodiments, pores and/or defects may be etched to enlarge their size.

15 Claims, 20 Drawing Sheets

Related U.S. Application Data

(60) Provisional application No. 62/418,055, filed on Nov. 4, 2016.

(51) Int. Cl.
| | |
|---|---|
| *B01D 71/02* | (2006.01) |
| *C01B 32/186* | (2017.01) |
| *C23C 16/02* | (2006.01) |
| *C23C 16/26* | (2006.01) |
| *C23C 16/56* | (2006.01) |

(52) U.S. Cl.
CPC ...... *C23C 16/0227* (2013.01); *C23C 16/0236* (2013.01); *C23C 16/26* (2013.01); *C23C 16/56* (2013.01)

(56) References Cited

U.S. PATENT DOCUMENTS

| | | | |
|---|---|---|---|
| 7,211,512 | B1 | 5/2007 | Ahn et al. |
| 9,744,617 | B2 | 8/2017 | Bedworth et al. |
| 9,901,879 | B2 | 2/2018 | Karnik et al. |
| 11,524,898 | B2 | 12/2022 | Kidambi et al. |
| 2002/0076837 | A1 | 6/2002 | Hujanen et al. |
| 2004/0001374 | A1 | 1/2004 | Tanaka et al. |
| 2004/0227157 | A1 | 11/2004 | U'Ren et al. |
| 2005/0227079 | A1 | 10/2005 | Ravi |
| 2007/0069401 | A1* | 3/2007 | Kakehata ................. C23C 8/36 257/E27.113 |
| 2007/0269646 | A1 | 11/2007 | Haverty et al. |
| 2009/0059430 | A1 | 3/2009 | Dobisz et al. |
| 2009/0072262 | A1 | 3/2009 | Iza et al. |
| 2011/0111300 | A1 | 5/2011 | DelHagen et al. |
| 2013/0187097 | A1 | 7/2013 | Hong et al. |
| 2013/0242000 | A1 | 9/2013 | Faralli et al. |
| 2013/0270188 | A1 | 10/2013 | Karnik et al. |
| 2015/0050753 | A1 | 2/2015 | Srinivasan et al. |
| 2015/0110998 | A1 | 4/2015 | Borrelli et al. |
| 2015/0273737 | A1 | 10/2015 | Chen et al. |
| 2016/0058932 | A1 | 3/2016 | Stetson, Jr. et al. |
| 2016/0137507 | A1 | 5/2016 | You et al. |
| 2016/0340792 | A1 | 11/2016 | Moffat et al. |
| 2017/0298504 | A1 | 10/2017 | Heise et al. |
| 2018/0185791 | A1 | 7/2018 | Karnik et al. |
| 2020/0316528 | A1 | 10/2020 | Karnik et al. |

OTHER PUBLICATIONS

Agrawal et al., Fabrication, pressure testing, and nanopore formation of single-layer graphene membranes. J Phys Chem C. 2017;121(26):14312-21. Epub Jun. 1, 2017.
Avila et al., Porphyrins as templates for site-selective atomic layer deposition: vapor metalation and in situ monitoring of island growth. ACS Appl Mater Interfaces. 2016; 8: 19853-9.
Blume et al., The influence of intercalated oxygen on the properties of graphene on polycrystalline Cu under various environmental conditions. Phys Chem Chem Phys. 2014;16: 25989-26003. Epub Oct. 23, 2014.
Boutilier et al., Implications of permeation through intrinsic defects in graphene on the design of defect-tolerant membranes for gas separation. ACS Nano. 2014;8(1):841-9. Epub Jan. 3, 2014.

Boutilier et al., Molecular sieving across centimeter-scale single-layer nanoporous graphene membranes. ACS Nano. 2017;11(6):5726-36. Epub Jun. 13, 2017.
Boutilier et al., Knudsen effusion through polymer-coated three-layer porous graphene membranes. Nanotechnol. Apr. 2017;28(18):184003(1-11). Epub Apr. 10, 2017.
Chang et al., Band gap engineering of chemical vapor deposited graphene by in Situ BN doping. ACS Nano. 2013;7(2):1333-41. Epub Dec. 30, 2012.
Chen et al., Photolithographic surface micromachining of polydimethylsiloxane (PDMS). Lab Chip. 2012;12:391-5. Epub Nov. 17, 2011.
Choi et al., Multifunctional wafer-scale graphene membranes for fast ultrafiltration and high permeation gas separation. Sci Adv. Nov. 23, 2018;4(11):eaau0476(1-10). doi: 10.1126/sciadv.aau0476.
Ci et al., Atomic layers of hybridized boron nitride and graphene domains. Nat Mater. May 2010;9:430-5. Epub Feb. 28, 2010.
Cohen-Tanugi et al., Water desalination across nanoporous graphene. Nano Lett. 2012;12:3602-8. Epub Jun. 5, 2012.
Emel'Yanov et al., Defect-deformation mechanism of the formation of a pore ensemble in semiconductor and metal etching: theory and experiment. Laser Phys. 2002; 12(12): 1432-36.
Gong et al., Direct chemical conversion of graphene to boron- and nitrogen- and carbon-containing atomic layers. Nat Commun. 2014;5:3193(1-8). Epub Jan. 24, 2014.
Huang et al., Single-layer graphene membranes by crack-free transfer for gas mixture separation. Nat Commun. 2018;9:2632(1-11). doi: 10.1038/s41467-018-04904-3. Epub Jul. 6, 2018.
Jang et al., Water and solute transport governed by tunable pore size distributions in nanoporous graphene membranes. ACS Nano 2017;11(10):10042-52. Epub Oct. 10, 2017.
Jiang et al., Porous graphene as the ultimate membrane for gas separation. Nano Lett. 2009;9(12): 4019-24. Epub Sep. 23, 2009.
Jiang et al., Nanometer-thick conformal pore sealing of self-assembled mesoporous silica by plasma-assisted atomic layer deposition. J Am Chem Soc. Aug. 30, 2006;128(34):11018-9.
Kidambi et al., A scalable route to nanoporous large-area atomically thin graphene membranes by roll-to-roll chemical vapor deposition and polymer support casting. ACS Appl Mater Interf. 2018;10(12):10369-78. Epub Mar. 19, 2018.
Kidambi et al., Selective nanoscale mass transport across atomically thin single crystalline graphene membranes. Adv Mater. May 2017;29(19):1605896(1-6). Epub Mar. 17, 2017.
Kidambi et al., Nanoporous atomically thin graphene membranes for desalting and dialysis applications. Adv Mater. Sep. 2017;29(33):1700277(1-8). Epub Jun. 28, 2017.
Kidambi et al., Facile fabrication of large-area atomically thin membranes by direct synthesis of graphene with nanoscale porosity. Adv Mater. Dec. 2018;30(49):1804977(1-10). Epub Oct. 9, 2018.
Kidambi et al., In situ observations during chemical vapor deposition of hexagonal boron nitride on polycrystalline copper. Chem Mater. 2014;26:6380-92. Epub Oct. 20, 2014.
Kidambi et al., The parameter space of graphene chemical vapor deposition on polycrystalline Cu . J Phys Chem C. 2012;116:22492-501. Epub Sep. 27, 2012.
Kidambi et al., Observing graphene grow: Catalyst-graphene interactions during scalable graphene growth on polycrystalline copper. Nano Lett. 2013;13:4769-78. Epub Sep. 16, 2013.
Kim et al., Synthesis of patched or stacked graphene and hBN Flakes: A route to hybrid structure discovery. Nano Lett. 2013;13(3):933-41. Epub Feb. 15, 2013.
Krivanek et al., Atom-by-atom structural and chemical analysis by annular darkfield electron microscopy. Nature. Mar. 25, 2010;464:571-4.
Lee et al., A review of reverse osmosis membrane materials for desalination—Development to date and future potential. J Memb Sci. 2011;370:1-22. Epub Dec. 24, 2010.
Li et al., Hexagonal boron nitride-graphene heterostructures: Synthesis and interfacial properties. Small. 2016;12(1):32-50. Epub Oct. 6, 2015.
Nilsen et al., Analytical model for island growth in atomic layer deposition using geometrical principles. J Appl Phys. Jul. 2007; 102: 024906.

(56)           References Cited

OTHER PUBLICATIONS

Niu et al., Growth intermediates for CVD graphene on Cu(111): Carbon clusters and defective graphene. J. Am. Chem. Soc. 2013;135:8409-14. Epub May 15, 2013.

O'Hern et al., Selective molecular transport through intrinsic defects in a single layer of CVD graphene. ACS Nano. 2012;6(11):10130-8. Epub Oct. 2, 2012.

O'Hern et al., Selective ionic transport through tunable subnanometer pores in single-layer graphene membranes. Nano Lett. 2014;14:1234-41. Epub Feb. 3, 2014.

O'Hern et al., Nanofiltration across defect-sealed nanoporous monolayer graphene. Nano Lett. 2015; 15:3254-60. Epub Apr. 27, 2015.

O'Neill et al., Catalyst design with atomic layer deposition. ACS Catal. 2015; 5: 1804-25.

Pan et al., Direct assessment of the mechanical modulus of graphene co-doped with low concentrations of boron-nitrogen by a non-contact approach. Nanoscale. Jun. 2014;6:8635-41. Epub Mar. 21, 2014.

Puurunena et al., Island growth as a growth mode in atomic layer deposition: A phenomenological model. J Appl Phys. Dec. 2004; 96: 7686-95.

Puurunena et al., Island growth in the atomic layer deposition of zirconium oxide and aluminum oxide on hydrogen-terminated silicon: growth mode modeling and transmission electron microscopy. J Appl Phys. Nov. 2004; 96(9): 4878-89.

Santinacci et al., Electrochemical pore formation onto semiconductor surfaces. Com Rend Chim. 2008; 11(9): 964-83.

Wei et al., Electron-beam-induced substitutional carbon doping of boron nitride nanosheets, nanoribbons, and nanotubes. ACS Nano. 2011;5(4):2916-22. Epub Mar. 22, 2011.

Wei et al., Synthesis of N-doped graphene by chemical vapor deposition and its electrical properties. Nano Lett. 2009;9(5):1752-8. Epub Mar. 27, 2009.

Zandiatashbar et al., Effect of defects on the intrinsic strength and stiffness of graphene. Nat Commun. 2014;5:3186(1-9). Epub Jan. 24, 2014.

* cited by examiner

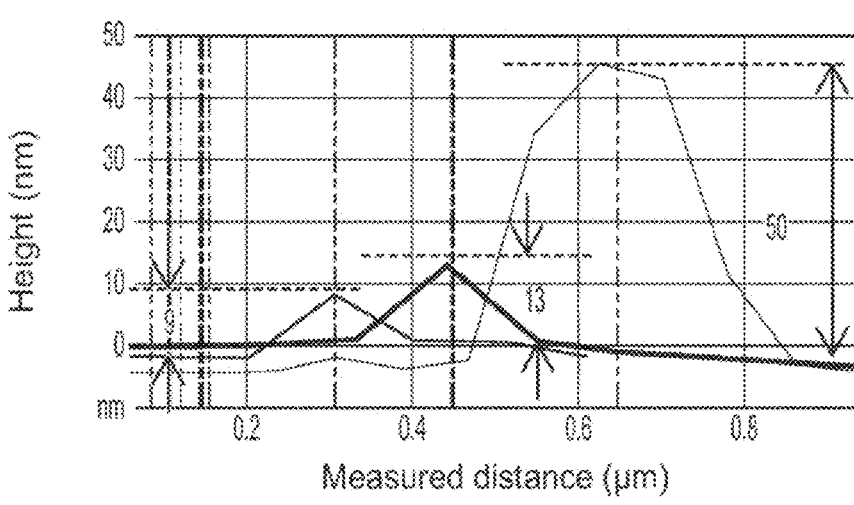
FIG. 17
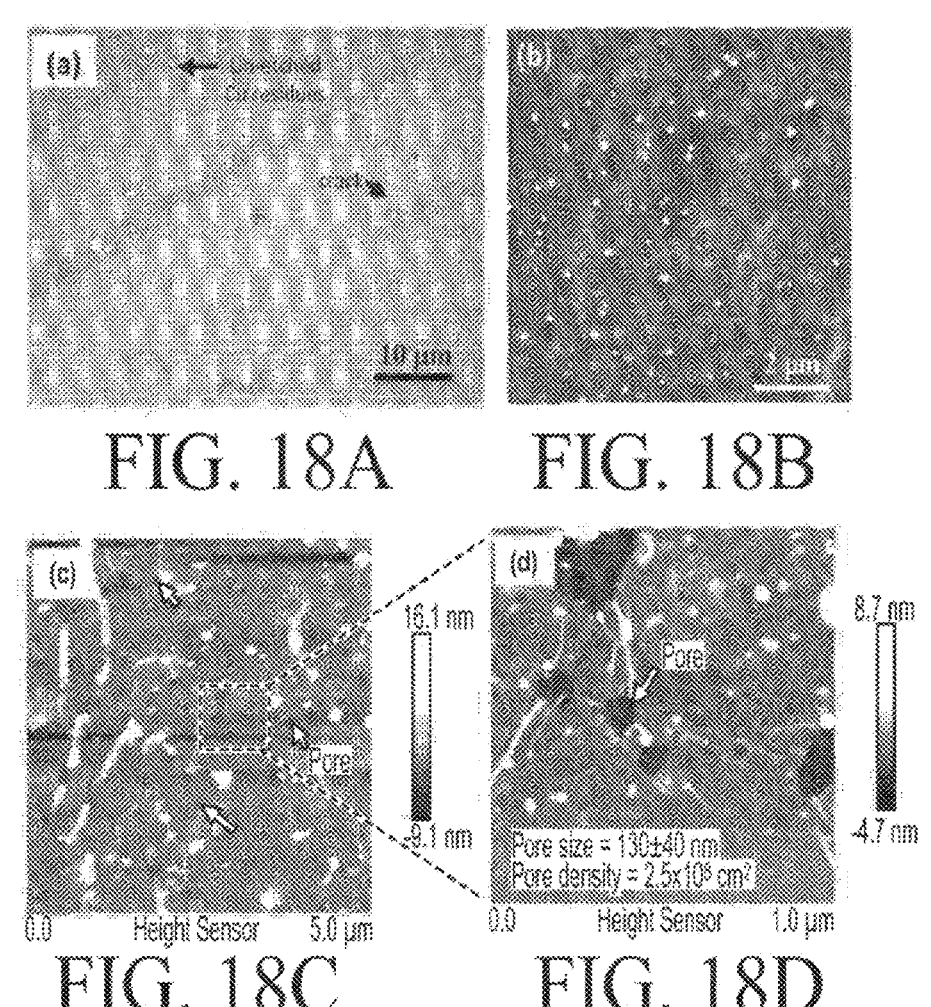
FIG. 18A          FIG. 18B
FIG. 18C          FIG. 18D

FORMATION OF PORES IN ATOMICALLY THIN LAYERS

CROSS-REFERENCE TO RELATED APPLICATIONS

This application is a continuation of U.S. patent application Ser. No. 16/081,157, filed Aug. 30, 2018, which is a national stage filing under 35 U.S.C. § 371 of International Patent Application Serial No. PCT/US2017/059984, filed Nov. 3, 2017, which claims the benefit under 35 U.S.C. § 119(e) of U.S. provisional application Ser. No. 62/418,055, filed Nov. 4, 2016, each of which is incorporated by reference in its entirety.

FEDERALLY SPONSORED RESEARCH

This invention was made with government support under DE-SC0008059 awarded by the U.S. Department of Energy. The government has certain rights in the invention.

FIELD

Disclosed embodiments are related to forming pores in atomically thin layers.

BACKGROUND

Many industries and applications, such as water purification, chemical synthesis, pharmaceutical purification, refining, natural gas separation, and many other applications rely on energy-intensive membrane separation as a major component of their processes. The need for membranes with high selectivity and flux for both liquid-phase and gas-phase membranes has led to many improvements in ceramic and polymer-based membranes over the past few decades. However, one of the primary challenges with filtration technology has been maximizing flux while maintaining high selectivity. Typically, an increased flux rate results in a decreased selectivity. Low chemical resistance is another challenge, which limits applications in chemical separations as well as methods for fouling control. While several decades of research has resulted in development of polymeric or ceramic membranes, further advances in membrane technology will likely rely on new membrane materials that provide better transport properties. Recent advances in atomically thin, i.e. two-dimensional (2D), materials such as graphene have opened new opportunities to advance membrane technology, where these atomically thin materials can be used to form atomically thin layers that act as the active layer in a filter assembly while providing enhanced selectivity and/or flux.

SUMMARY

In one embodiment, an article includes a substrate comprising a first material and a plurality of islands. The plurality of islands comprise a second material that is a product of the first material. Additionally, an atomically thin layer is disposed on a portion of the substrate comprising the first material.

In another embodiment, a method includes: exposing a substrate comprising a first material to a reactive atmosphere such that a plurality of islands comprising a product of the first material are formed on the substrate; and growing an atomically thin layer on a portion of the substrate comprising the first material.

In yet another embodiment, a method includes: growing an atomically thin layer at a first temperature in a first atmosphere with a first composition; and cooling the atomically thin layer from the first temperature to a second temperature, wherein defects in the atomically thin layer are formed during growth of the at least one atomically thin active layer and/or etched during cooling from the first temperature to the second temperature.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 17 is a line scan of an atomic force micrograph taken showing the relative heights of copper oxide islands formed on a copper substrate surface relative to a graphene layer formed thereon;

FIG. 18A is an optical micrograph of graphene transferred onto a 300 nm SiO2/Si wafer;

FIG. 18B is a scanning electron micrograph of the transferred graphene shown in FIG. 18A;

FIGS. 18C-18D are atomic force micrographs of the transferred graphene shown in FIG. 18A;

DETAILED DESCRIPTION

Figure 1:
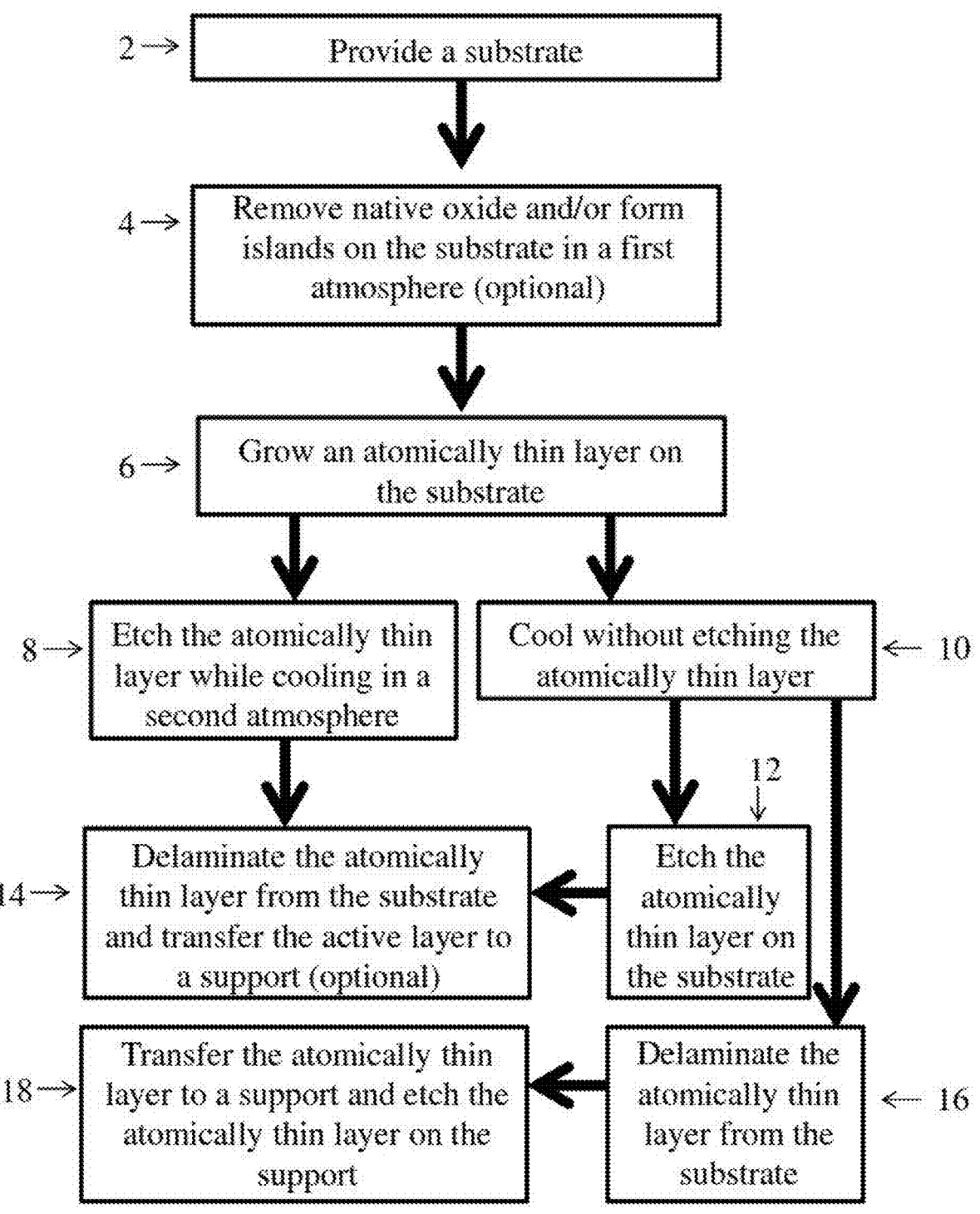
FIG. 1 is a schematic flow diagram of a formation process for forming pores in an active layer.

The inventors have recognized that two-dimensional atomically thin materials including a single, or in some instances several, atomic layers, have immense potential as a highly-permeable, highly-selective filtration membranes. Due to the ability to create angstrom and nanometer scale pores in a single sheet of these materials, atomically thin materials have the ability to effectively and efficiently permit selective transport of molecules for filtration in liquid and/or gas separation processes. Additionally, and without wishing to be bound by theory, the ultrathin thicknesses associated with these materials may permit extremely high permeance and corresponding flow rates while maintaining improved selectivity as compared to less-organized polymeric membranes.

In view of the above, the inventors have recognized that it may be beneficial to provide a membrane active layer including controllably sized and positioned pores in applications such as ultrafiltration, nanofiltration, reverse osmosis, and other membrane applications to provide a desired level of selectivity. As compared to the random distribution and alignment of the intrinsic pores formed in one or more atomically thin layers, actively creating pores in one or more atomically thin layers may advantageously provide pores through a single active layer, or multiple stacked active layers, in which the pores pass from one side of the active layer(s) to the other opposing side. Further, when these pores are created in a stack of active layers, the pores in each active layer may be substantially aligned with one another. However, regardless of how the pores are generated, or whether the pores are present in a single active layer, or in a stack of active layers, the sizes and shapes of the pores may be controlled to create pore sizes appropriate for filtering molecules, particles, ions, and/or any other desired filtrate with any appropriate size. This ability to provide pores that pass from one side of the active layer(s) to the other may be used to enable the production of membranes with both high selectivity and permeance.

In certain embodiments, pores with controlled sizes and/or positions may be introduced into an atomically thin layer during the growth process. In some embodiments, the atomically thin layer may be grown on a substrate comprising one or more topological features that induce defect and/or pore formation in an atomically thin layer grown thereon. For instance, an atomically thin layer may be grown on a substrate including a plurality of distributed islands of material formed on the substrate surface such that the atomically thin layer forms around the islands on the exposed substrate surface but not on or above the islands.

That is, in one embodiment, the islands may extend past the atomically thin layer during and/or after growth in a direction oriented away from the substrate. In some exemplary embodiments, the islands may be viewed as extending in a vertical direction past the atomically thin layer from the perspective of a substrate that is located in a horizontal orientation. Therefore, it should be understood that a vertical direction may be used synonymously with a direction that is oriented away from a corresponding substrate. Such a growth process may result in the formation of an atomically thin layer including pores that are filled by the plurality of islands, especially if the island is formed of a material that does not promote growth of the atomically thin layer. However, in some embodiments, the islands may be located in the same plane as, or may form a depression in, the substrate surface, i.e. they do not extend outwards from the substrate surface. In such an embodiment, the material these plurality of islands are formed from on the substrate surface may also be less energetically favorable for depositing the atomically thin layer on as compared to the surrounding portions of the substrate. Therefore, the atomically thin layer may preferentially grow on the exposed portions of the substrate surface while not being deposited on top of the islands.

In some embodiments, the above noted islands are formed by reacting a first component with a material of the substrate surface to form a compound thereon. Alternatively, in other embodiments, such islands may be obtained by a variety of other means including, for example, particles or molecules of a different material or element that produces defects or pores in an atomically thin layer grown thereon may be dissolved or alloyed into the substrate, coated onto the substrate, deposited using atomic layer deposition (ALD), and/or any other appropriate method of depositing or forming islands on a substrate surface. Post processing steps, such as transferring the atomically thin layer to a supporting substrate and/or etching of the islands, and/or the associated substrate, may be performed in order to form an atomically thin layer with open pores having a desired size and/or density within the atomically thin layer as described further below.

In another embodiments, pores with controlled size and/or position may be formed in an atomically thin layer by first growing the atomically thin layer on a substrate under one or more conditions, such as under a first atmosphere and/or temperature, that promotes the formation of defects of desired type, density, and/or size, including pore defects. These defects formed during growth may then be selectively etched either during a cool down phase of the atomically thin layer and/or after cooling of the atomically thin layer to form pores of a desired size and/or density. For example, the first atmosphere may have a first composition, and an associated formation temperature, for the deposition of an atomically thin layer with a desired density and type of defects in the deposited atomically thin layer. Without wishing to be bound by theory, a temperature may be selected that balances the rate of defect formation against a defect relaxation, or annealing, rate to provide the desired type and density of defects in the deposited atomically thin layer. The defects present in the atomically thin layer may then be selectively etched to form pores. Depending on the embodiment, an atomically thin layer may be etched using any appropriate process after it has been cooled to a second lower temperature, such as room temperature. The atomically thin layer may also be etched during cooling from the first formation temperature to a second lower temperature, such as room temperature, using an appropriate second atmosphere with a second composition that selectively etches the defects present in the atomically thin layer. Alternatively, in another embodiment, the growth temperature and atmosphere composition during growth of an atomically thin layer may be controlled to control both a density and size of the defects formed in the atomically thin layer. In such an embodiment, the atomically thin layer may be grown in a first atmosphere having a first composition at a first temperature during with the atomically thin layer is formed with the desired density and size defects. The atomically thin layer may then be cooled to a second lower temperature after formation.

As used herein, an "atomically thin layer" will be understood by those of ordinary skill in the art to refer to a layer of material that is made up of one or more layers of an atomically thin material. Atomically thin materials typically have strong chemical bonds within a plane or layer, but have relatively weaker bonds out of the plane with neighboring planes or layers. Therefore, atomically thin materials typically form sheets of material that may be a single atom thick, i.e. monolayer sheets, to thicker sheets that include several adjacent planes of atoms. For example, an atomically thin layer and/or material may be considered to be a sheet or layer of material including one or more adjacent crystal planes extending parallel to a face of the sheet or layer. An atomically thin material may have a thickness corresponding to any appropriate number of crystal planes including sheets with a thickness corresponding to 1 atomic layer, or in some instances, a thickness that is less than or equal to 2, 3, 4, 5, or 10 atomic layers, or any other appropriate number of atomic layers. Further, depending on the particular type of atomically thin layer and/or material being used, the atomically thin layer and/or material may have a thickness between 0.1 nm and 10 nm, or between 0.3 nm and 5 nm, or between 0.345 nm and 2 nm. However, ranges both larger and smaller than those noted above are also contemplated as the disclosure is not so limited. Atomically thin materials may also be referred to as ultra-strength materials and/or two-dimensional materials.

For the sake of clarity, the embodiments and examples described below are primarily directed to the use of graphene. However, the methods and membranes described herein are not so limited. For example, appropriate atomically thin materials that may be used to form an atomically thin layer include, but are not limited to, hexagonal boron nitride, molybdenum sulfide, vanadium pentoxide, silicon, doped-graphene, graphene oxide, hydrogenated graphene, fluorinated graphene, covalent organic frameworks, layered transition metal dichalcogenides (e.g., $MoS_2$, $TiS_2$, etc.), two dimensional oxides (e.g. graphene oxide, $NiO_2$, etc.), layered Group-IV and Group-III metal chalcogenides (e.g., SnS, PbS, GeS, etc), silicene, germanene, and layered binary compounds of Group IV elements and Group III-V elements (e.g., SiC, GeC, SiGe), and any other appropriate atomically thin material. Additionally, in some embodiments the methods described herein may be applied to the production of thicker non-atomically thin membrane materials such as graphene containing multiple atomic layers, graphene oxide containing multiple atomic layers, metal organic frameworks, thin-layer atomic layer deposition of metal oxides ($AlO_2$, $HfO_2$, etc.), zeolites, and other appropriate materials as well.

It should be understood that a substrate on which an atomically thin layer is formed may comprise any suitable material. In some embodiments, the substrate may comprise at least one of a metal, a metalloid, and/or a transition metal catalyst. In certain embodiments, the substrate may comprise a transition metal. For example, a substrate may comprise at least one of copper, nickel, cobalt, platinum, iron, gold, silver, germanium, ruthenium, iridium, rhenium, and rhodium. Further, in some embodiments, a substrate may comprise an alloy including at least one of copper, nickel, cobalt, platinum, iron, gold, silver, germanium, ruthenium, iridium, rhenium, and rhodium. In some embodiments, the substrate may comprise an alloy where each component of the alloy is one of copper, nickel, cobalt, platinum, iron, gold, silver, germanium, ruthenium, iridium, rhenium, and rhodium. In certain embodiments, the substrate may comprise at least one of copper and nickel. In certain embodiments, the substrate may be a copper-nickel alloy. However, it should be understood that other substrate materials are also contemplated as the disclosure is not limited in this fashion.

While the use of a single atomically thin layer is primarily discussed herein, embodiments in which a plurality of atomically thin layers are incorporated into a filtration membrane active layer are also contemplated. For example, an active layer may include a stack of two or more atomically thin layers. Additionally, each of these atomically thin layers of material may correspond to sheets or layers of material exhibiting thicknesses that are a single atom thick, or multiple atoms thick as the disclosure is not so limited. Further, these atomically thin layers may simply be disposed, and/or bonded to one another, in any appropriate fashion as the disclosure is not so limited. For instance, adjacent atomically thin layers may simply be stacked on one another, thermally bonded to one another, grown as a multi-layer stack, or chemically bonded to one another using physical or chemical interactions with intercalating or cross-linking ions, atoms, or molecules.

As used herein, a "defect" within an atomically thin material and/or layer will be understood by those of ordinary skill in the art to mean a portion of the material and/or layer that is significantly different than the material and/or layer as a whole. For example, defects may correspond to lattice defects, tears, punctures, pores/holes, or any other appropriate features. In one such embodiment, a defect in a sheet of graphene may correspond to: a discontinuity in the shared carbon ring structure resulting from a particular fabrication process, due to damage to the sheet defining a hole, or the like; dopants; grain boundaries and other lattice defects; and/or any other appropriate feature that presents a discontinuity in the crystal structure of the atomically thin layer or material.

Without wishing to be bound by theory, the methods of creating defects in atomically thin layers, as well as the resulting materials and structures, may help to enable the production of highly selective membranes using one or more atomically thin layers of material that are selective to a desired filtrate, molecule, compound, and/or atom. Additionally, while the embodiments described herein are directed to atomically thin materials, the disclosed methods could also be applied to membranes with finite thickness as well.

In addition to the above, the disclosed methods of manufacture, and the resulting membranes, may be applied to any number of different applications. For example, some commercial applications of the described membranes include, but are not limited to: water purification to remove pathogens, organic molecules, and salts (desalination/softening); portable water filters; preconcentrators for liquid or gas samples for use in sensing applications; gas separation in energy applications such as natural gas separation (methane from carbon dioxide, hydrogen sulfide, and heavier hydrocarbons) and carbon sequestration; dialysis in biological research; medical implants for allowing only select molecules to go through (e.g., for sensor applications); controlled drug release devices; solvent-based chemical separations, solvent separations, enantiomer separations, and in fuel cells as proton-selective membranes to name a few.

Turning now to the figures, specific non-limiting embodiments are described in more detail. It should be understood that various features of the separately described embodiments may be used together as the current disclosure is not limited to the specific embodiments depicted in the figures and described below.

FIG. 1 depicts a generalized flow diagram for one embodiment of a manufacturing process of an atomically thin layer. More detailed descriptions of the various steps are provided below in reference to the other figures. In step 2, a substrate on which the atomically thin layer is to be grown is provided. The substrate may be any suitable material capable of supporting the atomically thin layer, and will be described in further detail below. In optional step 4 a native oxide on the substrate may be removed and/or islands, or other vertical protrusions, may be formed on a surface of the substrate on which the atomically thin layer is to be grown. In one such embodiment, islands may be formed on the substrate surface by forming a compound from materials present in the substrate and a corresponding atmosphere that the substrate is located within. For example, this may be accomplished by oxidizing the surface in an oxidizing atmosphere though it should be understood that other types of compounds and types of atmospheres might be used to form islands with desired size, shape, and/or density on a substrate surface. In step 6, an atomically thin layer may be grown on the substrate. In some embodiments, chemical vapor deposition may be employed for step 6. However, embodiments in which the atomically thin layer is formed using other appropriate methods, for example, chemical exfoliation, hydrothermal synthesis, thermal decomposition, and Langmuir-Blodgett assembly are also contemplated as the disclosure is not so limited.

In some embodiments, formation and/or growth of an atomically thin layer typically occurs at an elevated first temperature. Accordingly, in some instances, the atomically thin layer may be cooled to a second lower temperature prior to further processing. To facilitate formation of a functional active layer, in some embodiments, and as shown in step 8, the atomically thin layer may be etched during the cooling process. However, in other embodiments, as shown in step 10, the atomically thin layer may be cooled without undergoing any etching. In this case, the atomically thin layer may be etched after cooling. Specifically, after the atomically thin layer has cooled, the atomically thin layer may be transferred to an appropriate supporting substrate, such a porous support membrane. This may either be accomplished by etching the atomically thin layer while it is still attached to the substrate it was grown on, see 12. Depending on whether or not the substrate is completely etched away, the atomically thin layer may be delaminated from the substrate and/or transferred to a support to form an active layer of an associated membrane at 14. Though in some embodiments, the atomically thin layer is not transferred to a support, and is instead retained on a partially etched substrate that may subsequently act as a porous support for the resulting active layer of a membrane. Alternatively, the atomically thin layer may be delaminated from the underlying substrate at 16 where it is subsequently transferred to a support where it may be etched at 18.

Figure 2:
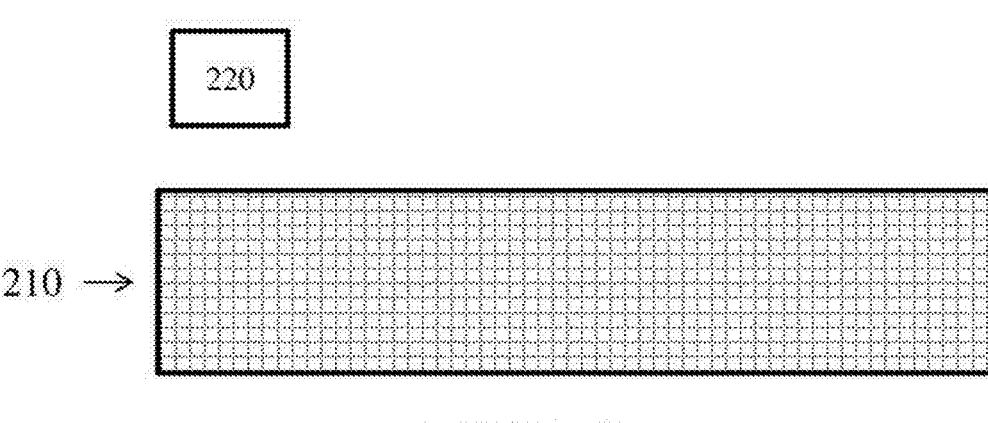
FIG. 2 is a schematic side view of a substrate exposed to a reactive atmosphere.
Figure 3A:
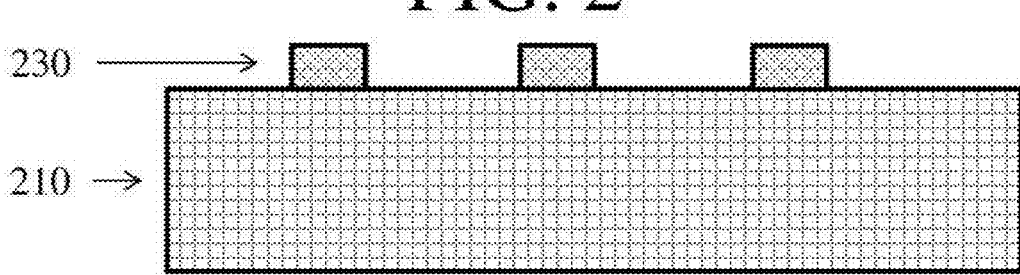
FIG. 3A is a schematic side view of a substrate including islands of a material grown on the substrate surface.
Figure 3B:
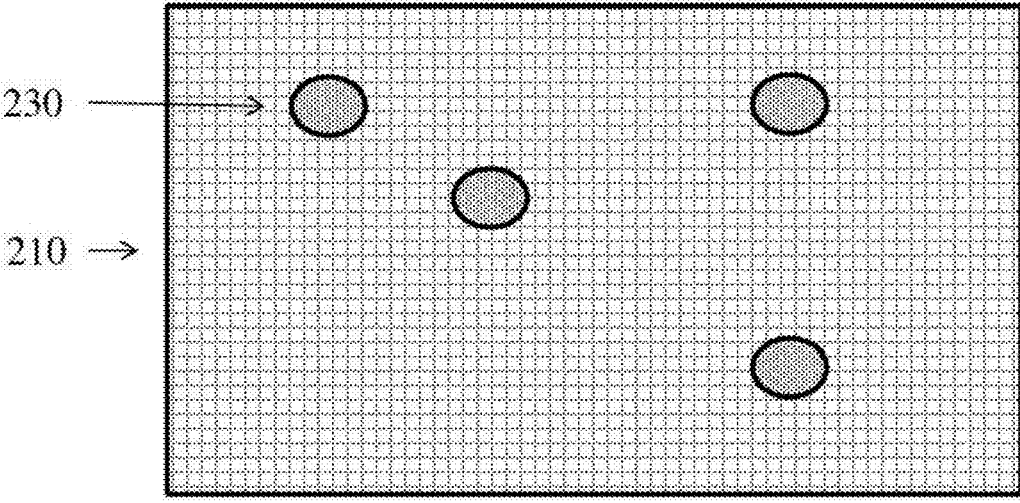
FIG. 3B is a schematic top view of the substrate and islands depicted in FIG. 3A.

The general concept of providing a substrate and forming islands on the substrate is depicted illustratively in FIGS. 2-3B. In FIG. 2, a substrate 210 is exposed to a first reactive atmosphere 220. In some instances the first atmosphere may have a first composition that is reactive with a surface of the substrate. A concentration of one or more reactive components of the first atmosphere, temperature, and/or a duration of exposure of the substrate to the first atmosphere, may be controlled such that the one or more reactive components react with a material of the exposed surface of the substrate to form islands 230 thereon, as shown in FIG. 3A and FIG. 3B. However, it should also be understood that not all embodiments described herein form islands on a substrate. Instead embodiments employing substrates that are free from islands may also be used as discussed in further detail below. Again while the depicted embodiment includes islands that extend away from a surface of the substrate, embodiments in which the plurality of islands comprise a material that is a product of the substrate material and are located within the same plane, or form a depression, in the substrate surface are also contemplated. Without wishing to be bound by theory, whether or not the islands form a depression, remain in the same plane, or extend away from the substrate surface will vary depending on whether or not forming the material of the islands causes the substrate material to expand, contract, or remain the same. For example, forming an oxide on the surface of a substrate will typically cause the formed material to expand, thus, forming islands that extend away from the substrate surface. In either case, the atomically thin layer formed on the substrate surface after island formation may be deposited onto the exposed portions of the substrate material while not being deposited onto the islands made from the product of the substrate material.

In some embodiments, a reactive atmosphere used to react with a substrate surface to form islands thereon may be an oxidizing atmosphere. For instance, the reactive atmosphere may comprise one or more oxidizing gases including, for example, one or more of oxygen, water vapor, carbon dioxide, nitrous oxide, combinations thereof, and/or any other appropriate gas. In embodiments in which the reactive atmosphere comprises an oxidizing gas, the oxidizing gas may be present in any suitable amount. In some embodiments, a reactive gas, such as an oxidizing gas, may have a partial pressure that is greater than or equal to a trace amount, 0.01%, 0.1%, 1%, 2%, 5%, 10%, 20%, 30%, 40%, or any other appropriate percentage of a total gas pressure. In some embodiments, the partial pressure of the reactive gas is less than or equal to 50%, 40%, 30%, 20%, 10%, 5%, 2%, or any other appropriate percentage of the total gas pressure. Combinations of the above-mentioned ranges are also possible (e.g., greater than or equal to 0.01% of the total gas pressure and less than or equal to 50% of the total gas pressure). Other ranges, both greater and less than those noted above, are also possible.

In certain embodiments, a reactive atmosphere used to form islands on a substrate may include a carrier gas. Depending on the particular embodiment, a carrier gas may be substantially inert with the substrate over the timescales over which the substrate is exposed to the material. For example, in some embodiments, the carrier gas may be a noble gas, such as argon and/or helium. When present, the carrier gas may make up any suitable amount of the total gas in the reactive atmosphere. In some embodiments, the partial pressure of the carrier gas is greater than or equal to 1%, 2%, 5%, 10%, 20%, 30%, 40%, 50%, 60%, 70%, 80%, 90%, 95%, 97%, 99%, 99.5%, 99.9%, 99.95%, or any other appropriate percentage of the total gas pressure. In some embodiments, the partial pressure of the carrier gas is less than or equal to 99.99%, 99.95%, 99.9%, 99.5%, 99%, 97%, 95%, 90%, 80%, 70%, 60%, 50%, 40%, 30%, 20%, 10%, 5%, 2%, or any other appropriate percentage of the total gas pressure. Combinations of the above-mentioned ranges are also possible (e.g., greater than or equal to 1% of the total gas pressure and less than or equal to 99.99% of the total gas pressure). Other ranges, both greater and less than those noted above, are also possible.

In some embodiments, a substrate may be exposed to a reactive atmosphere at an elevated temperature. In one such embodiment, the substrate may be exposed to the reactive atmosphere at a temperature of greater than or equal to 800° C., greater than or equal to 850° C., greater than or equal to 900° C., greater than or equal to 950° C., greater than or equal to 1000° C., greater than or equal to 1050° C., greater than or equal to 1100° C., greater than or equal to 1150° C., and/or any other appropriate temperature less than a melting and/or decomposition temperature of the substrate. In related embodiments, the substrate may be exposed to the reactive atmosphere at a temperature of less than or equal to 1200° C., less than or equal to 1150° C., less than or equal to 1100° C., less than or equal to 1050° C., less than or equal to 1000° C., less than or equal to 950° C., less than or equal to 900° C., less than or equal to 850° C., and/or any other appropriate temperature. Combinations of the above-referenced ranges are also possible (e.g., greater than 950° C. and less than 1050° C.). Other ranges are also possible including ranges both less than and greater than those noted above as the disclosure is not so limited.

As noted above, after exposure to the above noted reactive atmosphere, a plurality of islands 230 may be formed on a surface of a substrate 210, as shown in FIG. 3A and FIG. 3B. In some embodiments, the plurality of islands comprises a second material that is distinct from the substrate material (or first material). In certain embodiments, the second material is a product of the first material and one or more components of the reactive atmosphere. As used herein, a product of a material is a species that is formed after the material has undergone a chemical reaction. However, while many embodiments described herein are directed to products that form due to an oxidation reaction (i.e. islands including oxides), the methods and articles described herein are not so limited. For example, other appropriate reactions may include, for example, carbides may be used during the growth of hexagonal boron nitride, silicides, silicates, alloying reactions between a substrate and a material deposited on the substrate, and/or any other appropriate type of reaction capable of forming an island on a substrate for subsequent growth of an atomically thin layer as the disclosure is not so limited.

In embodiments where islands are present, the islands may have any suitable morphology such that they extend vertically upward from a surface of the substrate. In some embodiments, as shown in FIGS. 3A and 3B, the islands may emerge from the substrate at an angle that is substantially perpendicular to the substrate and may have substantially smooth and straight walls. However, this depiction should not be taken to be limiting. For instance, in some embodiments the islands may be formed on a substrate such that the islands form different angles with respect to a surface of the substrate they are formed on (e.g., 30°, 60°, etc.). Further, in certain embodiments, the islands may have rough side walls and/or the side walls may be curved (e.g., the islands have a circular, ovoid, or undulating shape in a plane comprising the perpendicular to the substrate). Accordingly, it should be understood that the islands formed on the substrate may have any appropriate shape and/or configuration relative to a substrate surface they are disposed on as the disclosure is not so limited.

Depending on the desired application, it may be desirable to form islands on a substrate with a particular combination of height, diameter, and/or density of islands which may be controlled using a concentration of a reactive gas, temperature, reaction time, and/or any other appropriate control parameter. Specific ranges for the various heights, diameters, and densities of the islands are provided below.

In certain embodiments, islands formed on a substrate surface may have an average height of greater than or equal to 5 nm, greater than or equal to 10 nm, greater than or equal to 20 nm, greater than or equal to 50 nm, greater than or equal to 100 nm, greater than or equal to 200 nm, greater than or equal to 500 nm, and/or any other appropriate height relative to an underlying substrate surface. Correspondingly, the islands may have an average height of less than or equal to 1 micron, less than or equal to 500 nm, less than or equal to 200 nm, less than or equal to 100 nm, less than or equal to 50 nm, less than or equal to 20 nm, or less than or equal to 10 nm, and/or any other appropriate height relative to an underlying substrate surface. Combinations of the above-referenced ranges are also possible (e.g., greater than or equal to 5 nm and less than or equal to 1 micron). Other ranges, including ranges both larger and smaller than those noted above, are also possible. As used herein, the average height of the islands may refer to the number average of the heights of the islands (i.e., the average height of each island may be found by averaging a distance between a top surface of an island and the substrate over the top surface of the island and then the average height of the islands may be found by averaging the average heights of the islands where each height is weighted by the number of islands with that average height). The average height of the islands may be measured using atomic force microscopy, interferometry, scanning tunneling miscroscopy, optical microscopy in annular dark field mode, nano-indentation, or any other appropriate method. Though again, embodiments in which the islands do not extend away from a surface of the substrate are also contemplated.

In some embodiments, islands formed on a substrate surface may have an average diameter of greater than or equal to 5 nm, greater than or equal to 10 nm, greater than or equal to 20 nm, greater than or equal to 50 nm, greater than or equal to 100 nm, greater than or equal to 200 nm, greater than or equal to 500 nm, and/or any other appropriate distance. Correspondingly, the islands may have an average diameter of less than or equal to 1 micron, less than or equal to 500 nm, less than or equal to 200 nm, less than or equal to 100 nm, less than or equal to 50 nm, less than or equal to 20 nm, less than or equal to 10 nm, and/or any other appropriate distance. Combinations of the above-referenced ranges are also possible (e.g., greater than or equal to 5 nm and less than or equal to 1 micron). Other ranges are also possible. As used herein, the average diameter of the islands may refer to the number average of the diameter of the islands (i.e., an average diameter may be computed for each island by determining the diameter of a circle that would enclose an equivalent area of an island projected onto the plane of the substrate and then averaging these average diameters where each diameter is weighted by the number of islands with that average diameter). The average diameter of the islands may be determined by atomic force microscopy, scanning electron microscopy, optical microscopy, and/or any other appropriate measurement.

In some embodiments, the density of islands formed on a substrate surface may be greater than or equal to 1 island per square micron, greater than or equal to 2 islands per square micron, greater than or equal to 5 islands per square micron, greater than or equal to 10 islands per square micron, greater than or equal to 20 islands per square micron, greater than or equal to 50 islands per square micron, greater than or equal to 100 islands per square micron, greater than or equal to 200 islands per square micron, greater than or equal to 500 islands per square micron, and/or any other appropriate density. In some embodiments, the density of the islands may be less than or equal 1000 islands per square micron, less than or equal to 500 islands per square micron, less than or equal to 200 islands per square micron, less than or equal to 100 islands per square micron, less than or equal to 50 islands per square micron, less than or equal to 20 islands per square micron, less than or equal to 10 islands per square micron, less than or equal to 5 islands per square micron, less than or equal to 2 islands per square micron, and/or any other appropriate density. Combinations of the above-referenced ranges are also possible (e.g., greater than or equal to 1 island per square micron and less than or equal to 1000 islands per square micron). Other ranges, including ranges both smaller and larger than those noted above, are also possible. The number of islands per square micron may be determined by any appropriate imaging method such as atomic force microscopy, optical microscopy, and/or scanning electron microscopy coupled with either manual and/or an automatic feature counting algorithm, such as an edge detection algorithm used to detect the presence of the islands.

In some embodiments, it may be desirable to remove a native oxide, and/or other material, present on the surface of a substrate prior to forming islands there on. In such an embodiment, the substrate may be treated in some manner before formation of islands on the substrate using the above noted reactive first atmosphere. For instance, a surface oxide and/or the material present on a substrate surface may be removed by exposing the surface to an oxidizing acid, such as nitric acid and/or sulfuric acid. Alternatively, in another embodiment, a surface oxide and/or the material present on the substrate surface may be removed by exposing the surface to an atmosphere that reduces the oxide and/or other material present on the surface. For example, a reducing atmosphere relative to a surface oxide, or other material, may include a reducing gas, such as hydrogen gas. In one specific example, a substrate may be exposed to a reducing atmosphere including both argon and hydrogen. Depending on the specific application, the first atmosphere may remove substantially all of the native oxide layer and/or material, though some of the native oxide layer and/or material may still be present as the disclosure is not so limited. Once the native oxide layer and/or the material has been removed from a surface of a substrate, the substrate may be exposed to an appropriate atmosphere to form the islands thereon as previously described.

In certain embodiments, a substrate may be annealed at an elevated temperature during the removal of a surface oxide and/or other material from the substrate. For instance, in some embodiments, a surface oxide and/or other material may be removed at a temperature of greater than or equal to 800° C., greater than or equal to 850° C., greater than or equal to 900° C., greater than or equal to 950° C., greater than or equal to 1000° C., greater than or equal to 1050° C., greater than or equal to 1100° C., greater than or equal to 1150° C., and/or any other appropriate temperature less than a melting temperature of the substrate. In some embodiments, a surface oxide and/or material may be removed at a temperature of less than or equal to 1200° C., less than or equal to 1150° C., less than or equal to 1100° C., less than or equal to 1050° C., less than or equal to 1000° C., less than or equal to 950° C., less than or equal to 900° C., less than or equal to 850° C., and/or any other appropriate temperature. Combinations of the above-referenced ranges are also possible (e.g., greater than or equal to 950° C. and less than or equal to 1050° C.). Other ranges are also possible. However, it should be understood that temperatures both greater than and less than those noted above are also contemplated including, for example, in certain embodiments, a surface oxide may be removed at room temperature or close to room temperature (e.g., at approximately 25° C., or between 20° C. and 30° C.).

Figures 4, 5A, 5B:
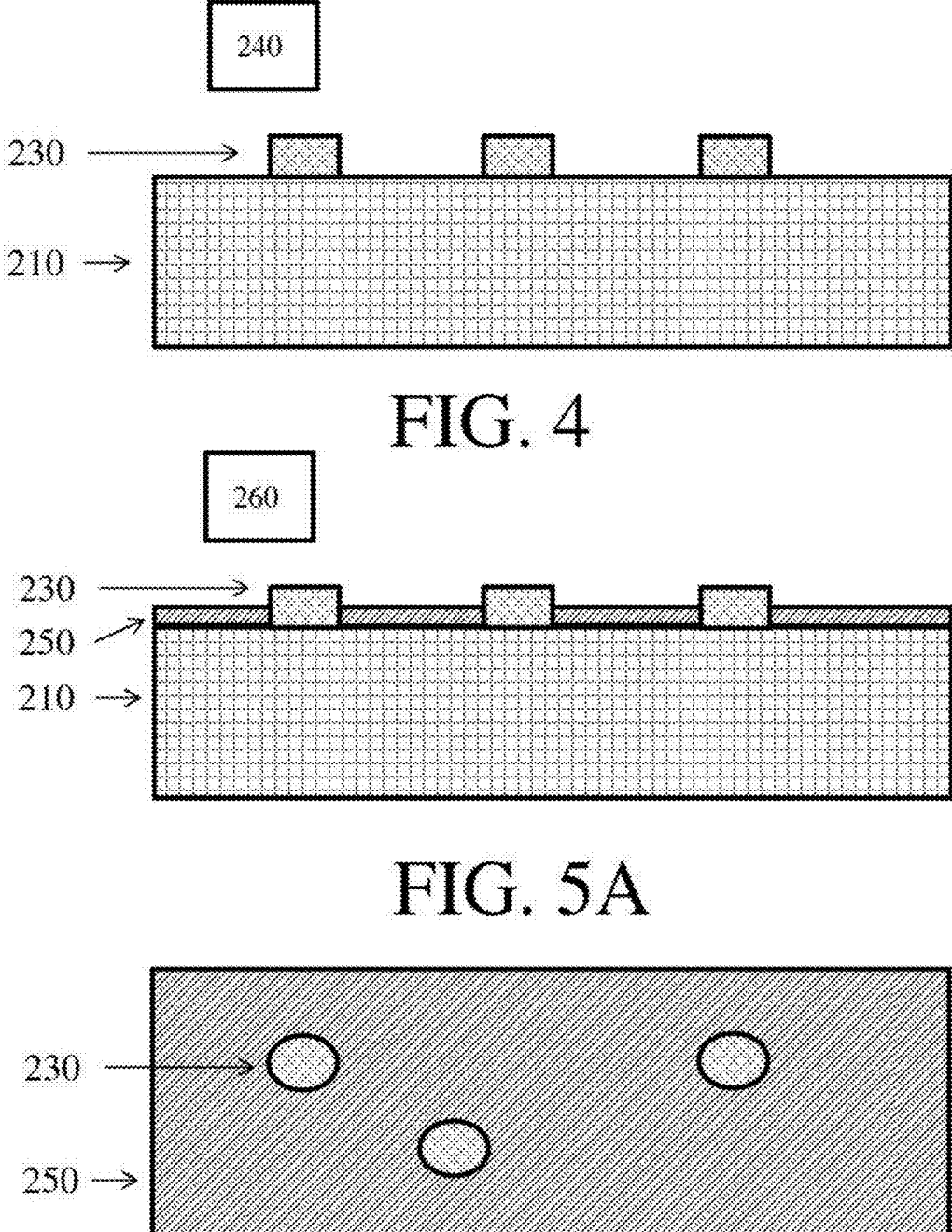
FIG. 4 is a schematic side view of a substrate include islands exposed to an atmosphere and conditions for growing an atomically thin layer thereon.
FIG. 5A is a schematic side view of a substrate including an atomically thin layer and islands grown on the substrate surface.
FIG. 5B is a schematic top view of the substrate, atomically thin layer, and islands depicted in FIG. 5A.

As shown in FIG. 4 and FIG. 5A-5B, after forming islands 230 on a substrate 210, an atomically thin layer 250 may be grown on the substrate around the islands. For example, in one embodiment, the atomically thin layer may be grown by exposing the substrate including the plurality of islands to an atmosphere 260 including one or more gaseous precursors that are deposited onto the substrate surface in such a way that they form an atomically thin material thereon. As shown schematically in FIG. 5A and FIG. 5B, the atomically thin layer may be deposited onto the substrate such that the atomically thin layer is disposed on a surface of the substrate and the plurality of islands extend upwards from the substrate surface through, and in some instances past a corresponding upper surface of, the atomically thin layer.

In some embodiments, the atmosphere and associated growth parameters and times may be selected such that the atomically thin layer is grown with very few or substantially no defects. For example, a temperature of the atomically thin layer growth process may be conducted above a relaxation temperature of the crystal structure such that defects present in the deposited atomically thin layer are annealed out of the crystal structure to below a desired defect size and/or density. However, embodiments in which the atmosphere and/or processing conditions are selected such growth of the atomically thin layer is conducted below the relaxation temperature of the crystal structure are also contemplated. In such an embodiment, the relaxation of defects formed in the atomically thin layer may be substantially retarded to provide a desired number and/or type of defect in the atomically thin layers formed. For example depending on the type and number of defects desired to be formed in a particular atomically thin layer, a temperature and/or composition of one or more atomic layer growth precursors may be balanced such that the competition between growth and etching of the atomically thin layer may be balanced to provide a desired density, size, and/or type of defect in the atomically thin layer.

When forming an atomically thin layer on a substrate, a corresponding atmosphere may include one or more precursors of the atomically thin layer. Further, the one or more precursors may be in any suitable state of matter. In some embodiments, the one or more precursors may comprise at least one of a gas, a liquid, and a vapor of a solid. In some embodiments, the one or more precursors may include one or more of: a hydrocarbon gas such as, methane and benzene; a nitrogen and boron containing gas such as borazine and ammonia borane; and hydrogen.

In certain embodiments, an atmosphere used to form an atomically thin layer on a substrate may comprise a carrier gas, such as an inert gas. Non-limiting examples of carrier gases include noble gases like argon and helium. When present, the carrier gas may make up any suitable amount of the total gas in the first atmosphere. In some embodiments, the partial pressure of the carrier gas is greater than or equal to 1%, 2%, 5%, 10%, 20%, 30%, 40%, 50%, 60%, 70%, 80%, 90%, 95%, 97%, 99%, 99.5%, 99.9%, 99.95%, or any other appropriate percentage of the total gas pressure. In some embodiments, the partial pressure of the carrier gas is less than or equal to 99.99%, 99.95%, 99.9%, 99.5%, 99%, 97%, 95%, 90%, 80%, 70%, 60%, 50%, 40%, 30%, 20%, 10%, 5%, 2%, or any other appropriate percentage of the total gas pressure. Combinations of the above-mentioned ranges are also possible (e.g., greater than or equal to 1% of the total gas pressure and less than or equal to 99.99% of the total gas pressure). Other ranges, both greater and less than those noted above, are also possible.

A temperature applied to the substrate during growth of an atomically thin layer in the above noted atmosphere (i.e., a first elevated temperature) may be any suitable value. In some embodiments, the temperature of the first atmosphere is greater than or equal to 300° C., 350° C., 400° C., 450° C., 500° C., 550° C., 600° C., 650° C., 700° C., 750° C., 800° C., 850° C., 900° C., 950° C., 1000° C., 1050° C., or any other appropriate temperature. In some embodiments, the temperature is less than or equal to 1100° C., 1050° C., 1000° C., 950° C., 900° C., 850° C., 800° C., 750° C., 700° C., 650° C., 600° C., 550° C., 500° C., 450° C., 400° C., 350° C., or any other appropriate temperature. Combinations of the above-referenced ranges are also possible (e.g., greater than or equal to 300° C. and less than or equal to 1100° C.). Other ranges, both greater and less than those noted above, are also possible.

After growing an atomically thin layer on a substrate including a plurality of islands, it may be desirable to etch the islands to form an atomically thin layer including a plurality of pores.

Figure 6:
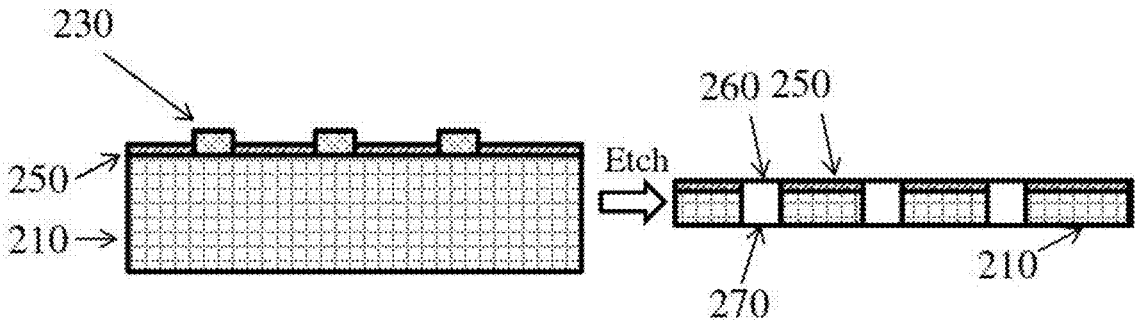
FIG. 6 is a schematic side view of a substrate, islands, and atomically thin layer undergoing an etching process.

FIG. 6 shows one embodiment of a possible etching process. In the depicted embodiment, both the islands 230 and at least a portion of the substrate 210 are preferentially etched relative to the associated atomically thin layer 250 formed on the substrate. As illustrated in the figure, if the etching process is continued long enough, the islands may be etched away and this etching process may continue through an underlying portion of the substrate. At the same time, an opposing side of the substrate is also being etched. When these two etch fronts meet each other, pores 270 may be formed in the substrate that are aligned with the corresponding pores 260 formed in the atomically thin layer that the islands were previously disposed in. Thus, at the conclusion of this process, a final structure may be obtained including an atomically thin layer disposed on a porous supporting substrate that includes pores that extend from the surface of the atomically thin layer through the bulk of the substrate to the surface of the substrate opposite the atomically thin layer. Of course, the etching process may also be continued until the substrate is completely etched away leaving only the atomically thin layer which may then be transferred onto a separate support as the disclosure is not so further, other processes for etching the islands are also possible. For instance, in some embodiments, only the islands are etched so that a structure comprising a porous atomically thin layer disposed on a pore-free substrate is obtained, or both the islands and a portion of the substrate are etched to form a porous atomically thin layer disposed on a substrate including indentations and/or cavities underlying the pores of the atomically thin layer that extend only partially through the substrate. It should be understood that any appropriate etchant capable of selectively etching the islands and/or substrate relative to the atomically thin layer may be used including, for example, ammonium persulfate, sulfuric acid, and ferric chloride. Alternatively, the atomically thin layer may be exposed to an atmosphere that selectively etches the islands and/or substrate relative to the atomically thin layer. For example, the atmosphere may be changed to be a reducing atmosphere relative to the oxides present in an island on a substrate, such as may occur when increasing a hydrogen content of the atmosphere, to selectively etch the oxide based islands.

Figure 7:
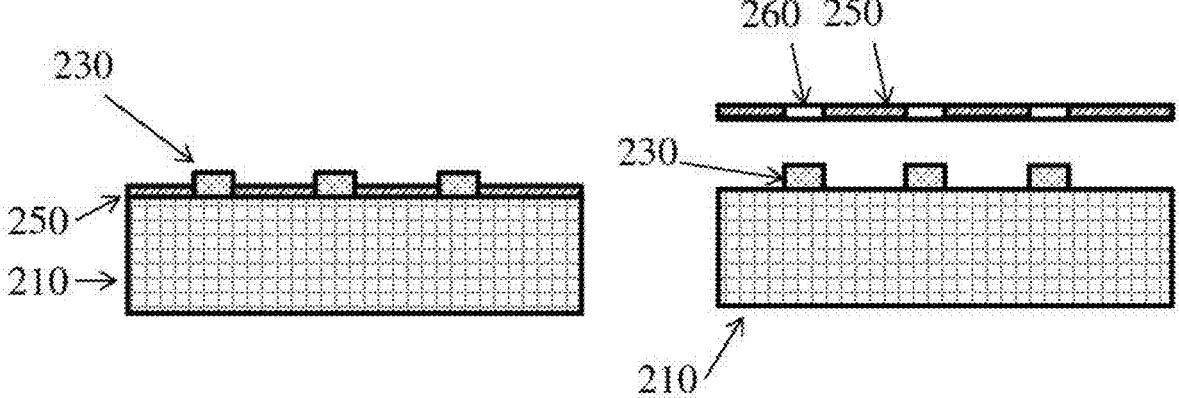
FIG. 7 is a schematic side view of a substrate, islands, and atomically thin layer undergoing a delamination process.

While an etching process has been described above, it should be understood that in other embodiments where an atomically thin layer 250 has been grown on a substrate 210 including a plurality of islands 230, the atomically thin layer may simply be delaminated from the substrate, see FIG. 7. In such an embodiment, the islands formed on the substrate may remain attached to the substrate when the atomically thin layer is delaminated. Accordingly, the atomically thin layer may include a plurality of pores 260 extending through the layer that previously included the islands disposed therein prior to delamination. The resulting atomically thin layer may then be transferred to a supporting substrate using any appropriate method.

Figures 8A, 8B, 8C, 9, 10:
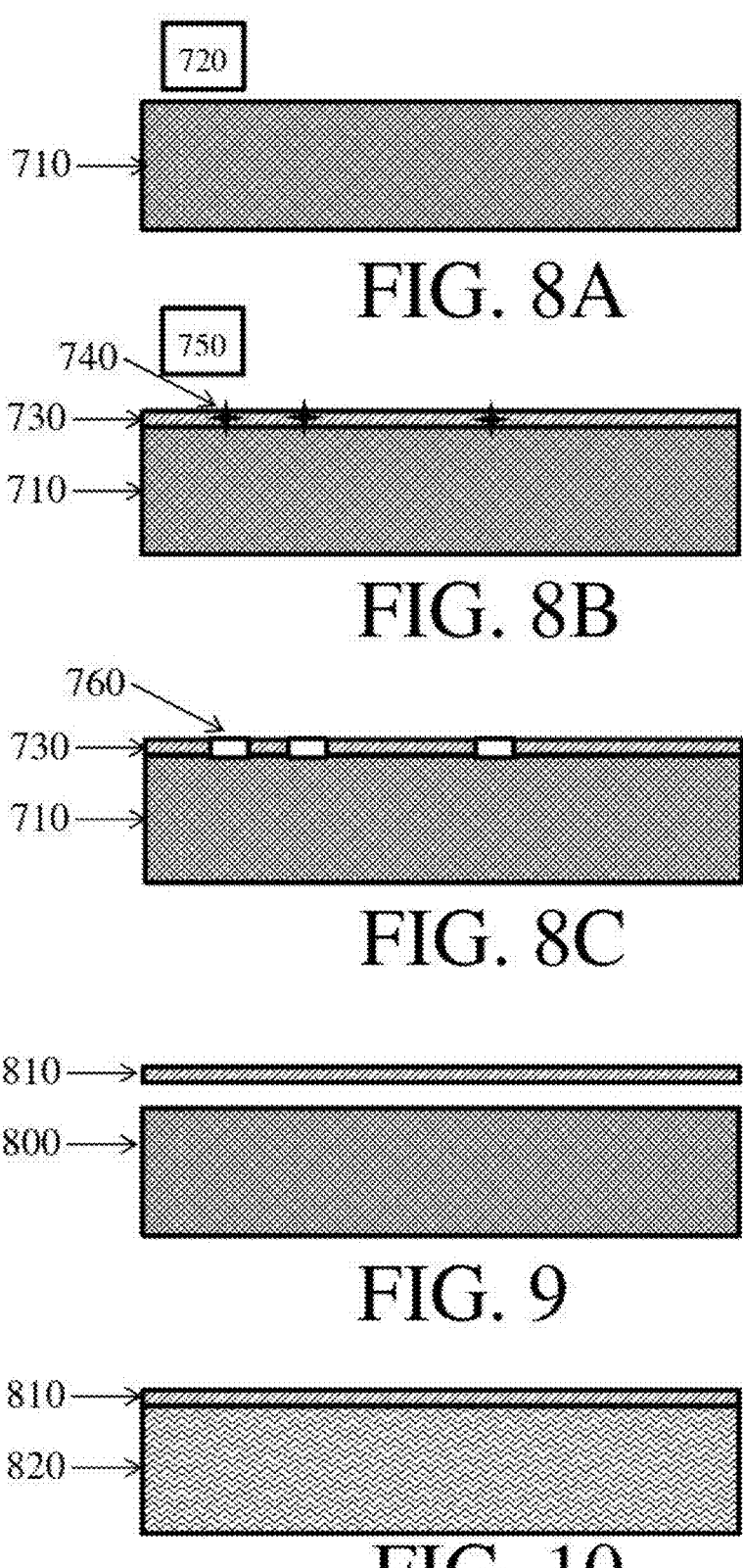
FIGS. 8A-8C are schematic side views of a substrate being exposed to a series of atmospheres to grow a graphene layer including defects that are subsequently etched to form pores.
FIG. 9 is a schematic side view of an atomically thin layer delaminated from a substrate.
FIG. 10 is a schematic side view of an atomically thin active layer disposed on a supporting substrate.

As noted previously, instead of forming pores using islands present on a substrate an atomically thin layer is grown on, in certain embodiments, pores may be formed in an atomically thin layer by selectively etching a plurality of defects present in the atomically thin layer. As noted previously, and as shown in FIGS. 8A-8C, an atomically thin layer 740 may be formed on a surface of a substrate 710 by exposing the substrate to an appropriate atmosphere 720 including one or more precursors of the atomically thin layer at an appropriate temperature. Further, the formation process may be controlled using temperature, types and concentrations of precursors in the atmosphere, dopants, substrate surface modifications, and/or any other appropriate control parameters to provide a desired density and/or type of defects 740 formed in the atomically thin layer. For example, a formation temperature of the atomically thin layer may be selected that balances the rate of defect formation against a defect relaxation, or annealing, rate to provide the desired type and density of defects in the deposited atomically thin layer for subsequent etching to form selective pores in the atomically thin layer. In certain embodiments, the resulting plurality of defects 740 in the atomically thin layer may be selectively etched using a second atmosphere 750 that selectively etches the defects to form pores 760 of a preselected size and/or density, though liquid etchants such as an aqueous solution comprising one or more of ammonium persulfate, sulfuric acid, and ferric chloride and/or any other appropriate form of etchants may also be used as the disclosure is not so limited. Further, depending on the particular etching process, it may be possible to etch only the atomically thin layer, to etch the atomically thin layer and a portion of the substrate, and/or to etch pores that extend through both the atomically thin layer and the substrate from an exterior side of the atomically thin layer to an opposing exterior side of the substrate.

As noted above, in certain embodiments, it may be desirable to etch an atomically thin layer by exposing the atomically thin layer to a second atmosphere that selectively etches the defects present therein for an appropriate duration and at an appropriate temperature to form pores from the defects in a desired density and/or size. In some embodiments, the second atmosphere may be more oxidizing than the first atmosphere. For example, in certain embodiments, the second atmosphere may comprise an etchant that is oxidative relative to the material present in the atomically thin layer. Thus, in one specific embodiment, the etchant may be a combination of gases such as gaseous oxygen, water vapor, ammonia, and/or gaseous hydrogen. Depending on the particular embodiment, the second atmosphere may comprise an etchant, such as one of the above noted gases and/or any other appropriate etchant at a partial pressure of greater than or equal to 0%, 5%, 10%, 15%, 20%, 25%, 30%, 35%, 40%, 45%, or any other appropriate percentage of the total pressure. In some embodiments, the etchant may also be present at a partial pressure of less than or equal to 50%, 45%, 40%, 35%, 30%, 25%, 20%, 15%, 10%, 5%, or any other appropriate percentage of the total pressure. Combinations of the above-referenced ranges are also possible (e.g., greater than or equal to 0% of the total pressure and less than or equal to 50% of the total pressure). Other ranges are both smaller and larger than those noted above are also possible.

In the above embodiments, it may be desirable to combine the processes for forming an atomically thin layer on a substrate with one or more processes for selectively etching defects and/or islands located within a plane of an atomically thin layer from the formation process. Therefore, in one embodiment, an atomically thin layer may be exposed to an atmosphere with a composition that selectively etches the defects and/or islands relative to substantially pristine portions of the atomically thin layer. For example, such a process may include exposing a substrate to a first atmosphere with a first composition at a first temperature to grow an atomically thin layer on the substrate. Regardless of whether islands and/or defects are used to form pores in the atomically thin layer, the resulting atomically thin layer may then be cooled from the first temperature to a second lower temperature while the atomically thin layer and substrate are exposed to a second atmosphere. The composition of the atmosphere may be changed from the first atmosphere to the second atmosphere either prior to and/or during cooling of the atomically thin layer. Again, a composition of the second atmosphere may be selected to include one or more components that selectively etch the islands, substrate, and/or defects present within an atomically thin layer relative to pristine portions of the atomically thin layer to form pores therein (e.g., the second atmosphere may promote etching of the plurality of islands, or may promote etching of the plurality of defects, substrate, etc.). Depending on the particular feature being selectively etched, different compositions may be used for the second atmosphere as previously discussed. For example, in embodiments where defects in a graphene layer are being selectively etched, the atmosphere may include one or more oxidative components such as gaseous oxygen, water, and/or carbon dioxide. Alternatively, in embodiments where islands formed on a substrate are being selectively etched, the atmosphere may include one or more components that are reducing relative to the materials of the islands such as an increased hydrogen concentration when selectively etching islands comprising an oxide of the underlying substrate.

In some embodiments, the second temperature a substrate is cooled to during an etching process may be greater than or equal to room temperature (i.e. 20° C.), 100° C., 200° C., 300° C., 500° C., 600° C., 700° C., 800° C., and/or any other appropriate temperature. Correspondingly, in some embodiments, the second temperature may be less than or equal to 950, 900° C., 800° C., 700° C., 600° C., 500° C., 300° C., or any other appropriate temperature. Combinations of the above-referenced ranges are possible (e.g., room temperature and 500° C. as well as between 300° C. and 950° C.). Other ranges both greater and smaller than those noted above are also possible.

In addition to cooling an atomically thin layer from the above noted first temperature to the second temperature, the cooling may be conducted at any suitable rate to provide a desired temperature time profile for the etching process. In some embodiments, the atomically thin layer may be cooled from the first temperature to the second temperature at a rate of greater than or equal to 0.1° C./minute, 0.2° C./minute, greater than or equal to 0.5° C./minute, greater than or equal to 1° C./minute, greater than or equal to 2° C./minute, greater than or equal to 5° C./minute, greater than or equal to 10° C./minute, 20° C./minute, 50° C./minute, 100° C./minute, 200° C./minute, and/or any other appropriate cooling rate. In some embodiments, the atomically thin layer may be cooled from the first temperature to the second temperature at a rate of less than or equal to 300° C./minute, 200° C./minute, 100° C./minute, 50° C./minute, 20° C./minute, 10° C./minute, 5° C./minute, 2° C./minute, 1° C./minute, 0.5° C./minute, 0.2° C./minute, and/or any other appropriate cooling rate. Combinations of the above-referenced ranges are also possible (e.g., greater than or equal to 0.1° C./minute and less than or equal to 300° C./minute). Other ranges both greater and less than those noted above are also possible.

Depending on the particular embodiment, a total pressure of an atmosphere used to grow an atomically thin layer on a substrate, and/or to etch an atomically thin layer disposed on the substrate, may be any suitable value. However, in certain embodiments, the total pressure of an atmosphere used during a cleaning, formation, and/or etching process, such during the chemical vapor deposition of an atomically thin material, may be greater than or equal to $10^{-6}$ mbar, $10^{-5}$ mbar, $10^{-4}$ mbar, $10^{-3}$ mbar, $10^{-2}$ mbar, $10^{-1}$ mbar, 1 mbar, 10 mbar, 100 mbar, or any other appropriate pressure. Correspondingly, the total pressure of the atmosphere may be less than or equal to 1 bar, 100 mbar, 10 mbar, 1 mbar, $10^{-1}$ mbar, $10^{-2}$ mbar, $10^{-3}$ mbar, $10^{-4}$ mbar, $10^{-5}$ mbar, or any other appropriate pressure. Combinations of the above-referenced ranges are also possible (e.g., greater than or equal to $10^{-6}$ mbar and less than or equal to 1 bar). Other ranges, both greater and less than those noted above, are also possible.

As described above, in some embodiments an atomically thin layer may be delaminated from the substrate and transferred to a support prior to or after etching. This is shown schematically in FIG. 9 and FIG. 10 where an atomically thin layer 810 has been delaminated from a corresponding substrate 800 that it was disposed on during a formation process. The atomically thin layer may then be transferred onto a corresponding supporting substrate 820 that may be porous in some embodiments. Typical methods for delamination include direct transfer, wherein the receiving support is brought into contact with the atomically thin layer, and the substrate is etched away using an etchant such as ammonium persulfate or ferric chloride. Other methods include transfer without etching of the substrate, such as by use of adhesive supports that can directly peel away the atomically thin layer from the substrate. Examples of such supports include heat-sensitive adhesive tapes or silicone elastomers. The atomically thin layer may then be re-deposited on other supporting substrates as noted above. Alternatively, carrier substrates such as PMMA, polycarbonate, or others may be coated on the atomically thin layer, and the initial support may be etched away. The atomically thin layer is then deposited on a support by dissolving or removing the carrier substrate after the atomically thin layer has been placed on the receiving support. These methods may be tailored to remove the islands from the atomically thin layer through chemical etching or mechanical removal, such as in leaving behind the atomically thin layer on the substrate when the atomically thin layer is removed. In such cases, the substrate may be recycled to grow an atomically thin layer again. It should be understood that while several transfer techniques are discussed above, any appropriate method of transferring or otherwise disposing an atomically thin active layer on a supporting substrate may also be used as the disclosure is not so limited. In addition, depending on the embodiment, an atomically thin layer may be etched either prior to or after transfer to a supporting substrate as the disclosure is not limited in this fashion.

In view of the above, the inventors have recognized that in some embodiments it may be desirable to form a supporting porous substrate on an atomically thin layer. Without wishing to be bound by theory, the depicted method may both reduce a number of processing steps which are involved in forming a final membrane, which may reduce processing costs, and reduce the chances for introducing damage to the atomically thin active layer during these transfer processes. Accordingly, the Inventors have recognized the benefits associated with forming a porous substrate to support the atomically thin active layer on the atomically thin active layer to eliminate the step of transferring the atomically thin active layer onto a separately formed porous substrate while also offering easily scalable processing that may be applied to large area active layers. In some embodiments, the supporting porous substrate formed on an atomically thin active layer may be a polyether sulfone (PES) support membrane. Though embodiments in which a porous substrate an active layer is disposed on may be made out of other materials including, but are not limited to, polyvinylidene difluoride (PVDF), polystyrene (PS), and other appropriate materials are also contemplated as the disclosure is not so limited.

Figure 33A:
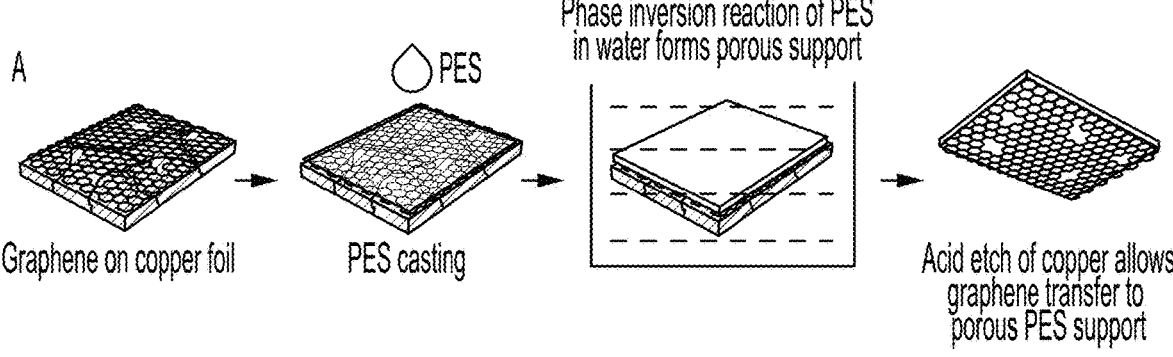
FIG. 33A is a schematic flow diagram of one embodiment of a method to form a porous PES substrate on an atomically thin active layer.

In one embodiment, a method that may be used to form a porous substrate on an atomically thin active layer is illustrated in FIG. 33A. In the depicted embodiment, an atomically thin active layer, such as graphene, is grown on a substrate, such as copper, as described herein. Depending on the embodiment, the growth of the graphene may either be controlled to provide a desired distribution of pore sizes and/or the pores may be formed in the atomically thin active layer either prior to, or after the formation of the substrate. In either case, a layer of a polymer casting solution, which may correspond to a mixture of a desired polymer resin and one or more solvents, is deposited onto a surface of the atomically thin active layer using any appropriate method. Appropriate methods include, but are not limited to spin coating, dip coating, drop casting, or any other appropriate way of applying the material to the atomically thin active layer. After depositing the layer of polymer casting solution, phase inversion may be used to transform the deposited layer into a desired porous support substrate. Appropriate types of phase inversion may include, but are not limited to: precipitation due to solvent evaporation; precipitation due to controlled evaporation of a solvent as compared to a non-solvent in the casting solution; thermal precipitation where the deposited layer is cooled from a higher first temperature to a second lower temperature to induce phase separation; and/or immersion precipitation where the layer is immersed in a coagulation bath, such as deionized water, that causes the polymer casting solution to phase separate to form the desired porous structure. An example of phase inversion using a coagulation bath is illustrated in the figure, where the assembly is immersed in a coagulation bath including water to form a porous substrate. The assembly is then etched to remove the original substrate, i.e. a copper substrate, the atomically thin active layer is grown on.

While any appropriate polymer casting solution may be used, in some embodiments, a polymer casting solution may include a combination of between about 0.1 weight percent (wt %) and 30 wt %, 10 wt % and 20 wt %, or 16 wt % polyether sulfone (PES) resin; between or equal to 70 wt % and 90 wt %, 75 wt % and 85 wt %, or 82 wt % N-Methyl-2-pyrrolidone (NMP); and between or equal to 0 wt % to 20 wt %, 0.5 wt % to 20 wt %, 0.5 wt % to 10 wt %, 1 wt % and 3 wt %, or 2 wt % isopropanol. The casting solution may be held at an elevated temperature for a first duration and allowed to degas at a lower temperature for a second duration. For example, the casting solution may be held between 50° C. and 100° C., including at 75° C., for approximately 24 hours prior to being cooled to room temperature and allowed to de-gas for about 12 hours. Additionally, these materials may be deposited onto an active layer formed on any appropriately sized substrate including, for example, foils with thicknesses between 15 µm and 20 µm as elaborated on in the examples. However, embodiments in which different thickness substrates are used are also contemplated. The polymer casting may then be immersed in a coagulation bath including deionized water.

While compositions with certain weight percentages and types of solvents and polymer resin are described above, it should be understood that porous substrates may be formed using polymer casting solutions that use different solvents, polymer resins, and/or weight percent ranges than those noted above as the disclosure is not so limited. For example, appropriate types of polymer resins may include, but are not limited to one or more of PES, PS, PVDF, a water insoluble polymer, and other conventional polymeric membrane materials. Appropriate types of additives may include, but are not limited to one or more of alcohols or any other appropriate type of small molecule. Additionally, appropriate types of solvents may include, but are not limited to, one or more of water, organic solvents, alcohols, acetone, isopropanol, ethanol, toluene, xylene, hexane, benzene, NMP, solutions of different ionics salts and water, combinations of the above, or any other appropriate type of solvent. Further, appropriate coagulation baths may include, but are not limited to, one or more of water, alcohols, acetone, isopropanol, ethanol, toluene, xylene, hexane, benzene, NMP, solutions of different ionics salts and water, combinations of the above, or any other appropriate type of coagulation bath.

The specific pore sizes, distributions, and other structures formed during phase inversion of a polymer casting layer may be influenced by any number of different parameters including, but not limited to: solvent composition and concentration; polymer resin composition; layer thickness; bath composition; and temperature to name a few. However, as shown in FIGS. 20B and 20C which are detailed further below in the examples, in some embodiments, the processing parameters may be selected to form a porous substrate that may include a first plurality of laterally interconnected pores 1300 located adjacent to a surface of an atomically thin active layer (the graphene layer whose cross section cannot be seen is located at the top of the depicted SEM micrograph) that the porous substrate is disposed on. This first plurality of pores may be fluidly coupled to a second plurality of elongated pores 1302 that extend away from the first plurality of pores to a surface of the overall membrane located opposite the atomically thin active layer. The first plurality of pores may have an average dimension, such as an average diameter, that is less than an average diameter or width of the second plurality of elongated pores. In some embodiments, as shown in the figure, the porous substrate may also include a plurality of nano and/or micro pores 1304 formed in the walls of, and that interconnect, the second plurality of elongated pores.

In one embodiment, the first plurality of pores may have an average dimension that is between or equal to about 200 nm and 500 nm and the plurality of elongated pores may have average diameters or widths that are on the size of micrometers including between or equal to about 2 µm and 10 µm or 2 µm and 5 µm. Of course while particular ranges of pore sizes are detailed above, different ranges of pore sizes both smaller and larger than those noted above are also contemplated as the disclosure is not so limited.

Figure 11:
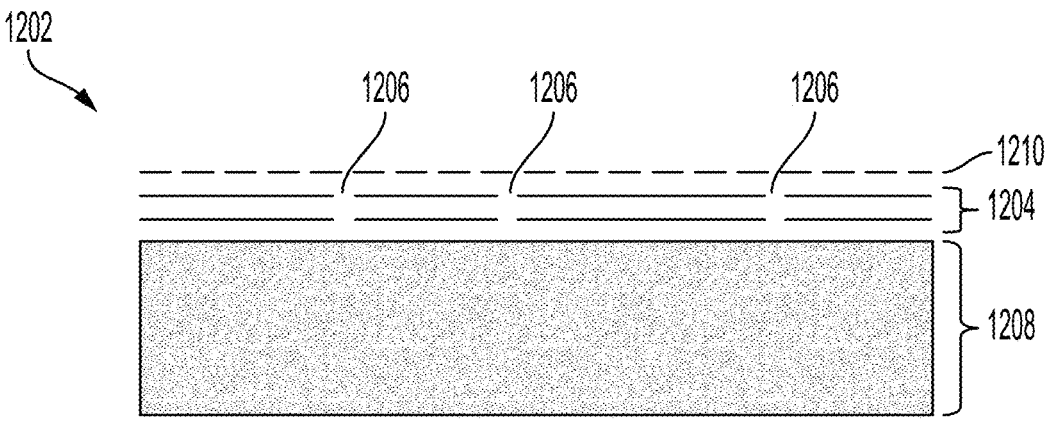
FIG. 11 is a schematic side view of a composite filtration membrane.

FIG. 11 shows one non-limiting example of an atomically thin layer on a supporting substrate. In this figure, a composite membrane 1202 may consist of an active separation layer of single or multiple stacked atomically thin layers 1204 with angstrom or nanometer-scale holes 1206 supported by a porous polymer, ceramic, or other supporting substrate 1208. As described in co-pending applications, U.S. patent application Ser. No. 13/835,173, filed Mar. 15, 2013, and U.S. patent application Ser. No. 14/530,292, filed Oct. 31, 2014, the disclosures of each of which are incorporated herein in their entirety: materials may be deposited into or otherwise associated with defects in an atomically thin layer; multiple atomically thin layers can be stacked one on top of another; and the flow resistances of a supporting substrate and corresponding atomically thin active layer forming a filtration membrane may be used to cover, block, and/or otherwise mitigate the presence of imperfections, such as tears, in an atomically thin layer to help improve membrane selectivity. For commercial applications, the durability of the membrane may also be important. Therefore, as detailed further below, in some embodiments, a protective coating 1210 may be applied to an outermost surface of the one or more atomically thin layers to help ensure that the membrane will function effectively after careless handling and/or repeated use.

Depending on the particular embodiment, a supporting substrate may be a porous supporting substrate, a handling supporting substrate, and/or a rigid or flexible supporting substrate. In some embodiments, the supporting substrate may provide structural support to the atomically thin layer. For example, the porous support may be polycarbonate track-etched membrane with pore diameters in the range of 5 nm to 10 microns, and pore lengths (i.e. support layer thickness) in the range of 1 micron to 5 mm. It may be a ceramic support with pores in the size range of 10 nm to 10 microns, and thickness in the range of 100 microns to 10 mm. Furthermore, the support structure itself may include multiple layers. For example, the polycarbonate layer may rest on a sintered steel porous support. Furthermore, the atomically thin layer may be transferred onto polymeric or other membranes, for example, asymmetric polyamide membranes. Porous substrates including unaligned random pore networks are also possible. For example, graphene based filtration membranes, and other similar membranes, may be combined with a variety of supporting substrates including, but not limited to, porous ceramics, porous metals, polymer weaves, nanofiltration membranes, reverse osmosis membranes, ultrafiltration membranes, brackish water filtration membranes, or any other appropriate substrate.

In some embodiments, other modifications to an atomically thin layer and/or a membrane comprising the atomically thin layer are also possible. For instance, as described above, for commercial applications, increasing the durability of the membrane may be desirable. Therefore, in some embodiments, a protective coating may be applied to the active layer to ensure that the membrane will function effectively after repeated handling and/or use. For example, the protective layer might be used to provide mechanical protection and/or antifouling properties such as anti-scaling or anti-biofouling. Appropriate protective layers include, but are not limited to: polymers deposited by layer-by-layer assembly such as polyethyleneglycol, polyamide, polysulfone, polyanionic and polycationic polymers; zwitterionic molecules; and nanoparticles such as silver and titania nanoparticles.

In some embodiments, the pores present in an atomically thin layer may be functionalized to enhance the selectivity of the composite membrane. For example, the pores may be functionalized such that they are hydrophobic or hydrophilic depending on the desired application. Specific forms of functionalization may include, but are not limited to, carboxyl groups, hydroxyl groups, amine groups, polymer chains (polyamide, polyethyleneglycol, polyamide, etc), small molecules, chelating agents, macrocycles, and biomolecules (e.g. crown ethers, porphyrins, calixarenes, deferasirox, pentetic acid, deferoxamine, DNA, enzymes, antibodies, etc.). In some embodiments, the above noted functionalizations, as well as other appropriate functionalizations, may be used to modulate transport of a molecule or particle through graphene. For example, and without wishing to be bound by theory: 15-crown-5 preferentially binds sodium ions and may thus regulate its transport, or, it may regulate the transport of other ions or molecules in response to binding of a sodium ion; polyethyleneglycol may preferentially allow transport of only small hydrophilic molecules and ions; and polyamide may allow for the preferential transport of water. In alternative embodiments, only the pores may be selectively functionalized. For example, the pores can have different chemical groups depending on the method of pore creation and treatment due to the pores oftentimes being more reactive than the surface of the active layer. These differences can be used to selectively functionalize only the pores. Thus, embodiments in which the surface and/or pores of the graphene are functionalized are possible.

Atomically Thin Layer Formation Using Oxide Islands

Experiments were conducted to create nanometer sized pores in extremely thin membranes (atomically thin 2D material i.e. graphene, boron nitride (h-BN) etc.) by modifications of a chemical vapor deposition (CVD) process used to synthesize the materials. This was achieved by changing process parameters before, during or after synthesis by CVD. These methods allowed for the creation of nanometer sized pores using a single process, which would otherwise need several pore creation processes after synthesis. Specifically, the introduction of trace amounts of oxygen formed copper oxide (CuOx) nanoparticles, or islands, on the copper catalyst substrate (polycrystalline copper foils) surface during annealing at high temperature (200° C.-1000° C.) before graphene growth. These oxide particles formed before growth on the catalyst foil prevent the formation of graphene in the regions they occupy thereby forming nanopores. Post synthesis etching of the islands and/or substrate was performed by introducing etching species during the cooling phase of the CVD.

Figure 12:
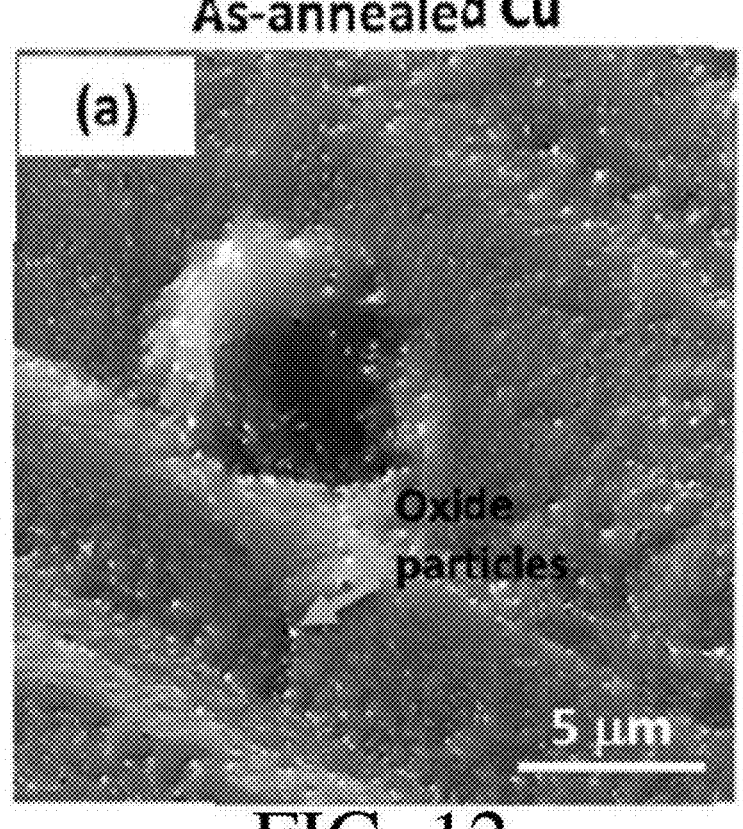
FIG. 12 is a scanning electron micrograph of oxide islands formed on a copper substrate surface.
Figure 13:
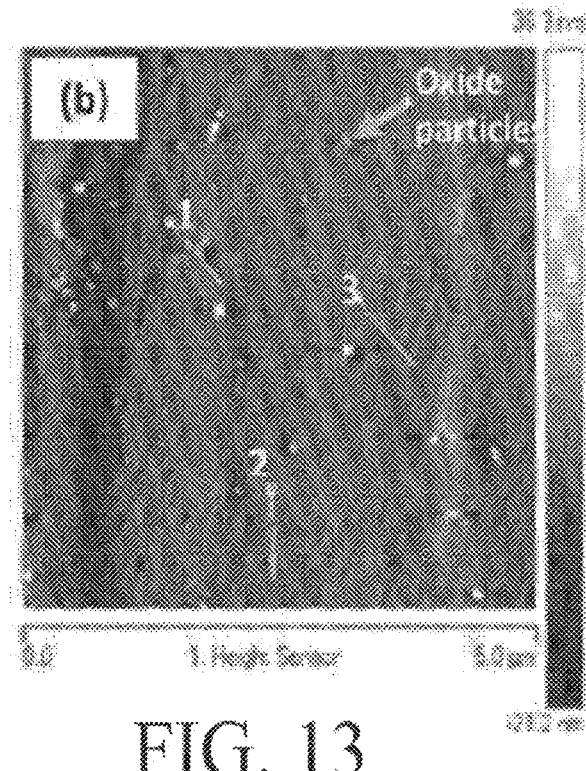
FIG. 13 is an atomic force micrograph of copper oxide islands formed on a copper substrate surface.
Figure 14:
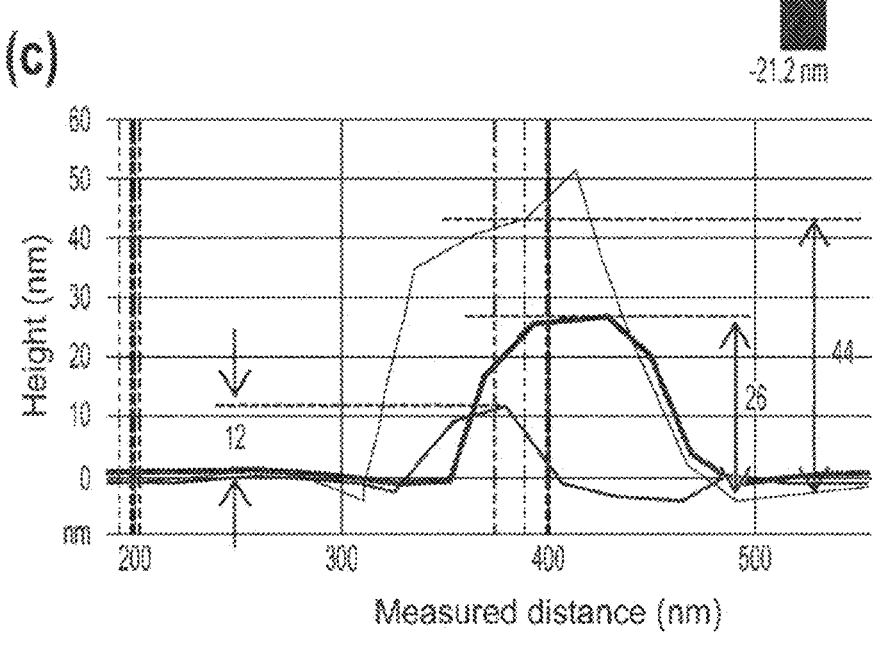
FIG. 14 is a line scan of an atomic force micrograph taken of copper oxide islands formed on a copper substrate surface.
Figure 15:
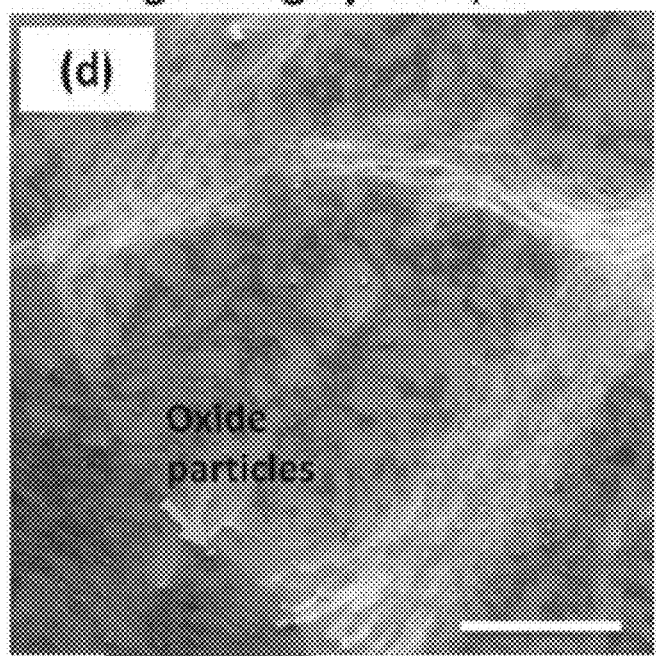
FIG. 15 is a scanning electron micrograph of graphene grown on a substrate surface including oxide islands formed thereon.
Figure 16:
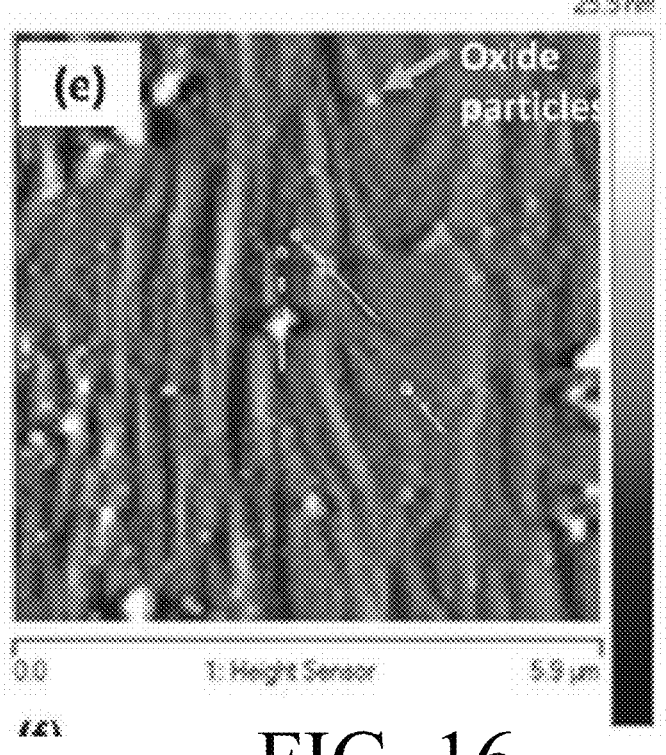
FIG. 16 is an atomic force micrograph of graphene grown on a substrate surface including oxide islands formed thereon.
Figure 19:
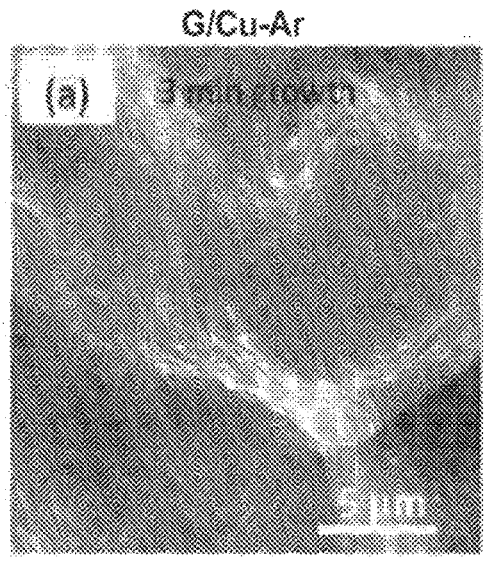
FIG. 19 is a scanning electron micrograph of graphene grown on a copper substrate pre-annealed under an argon atmosphere.
Figure 20:
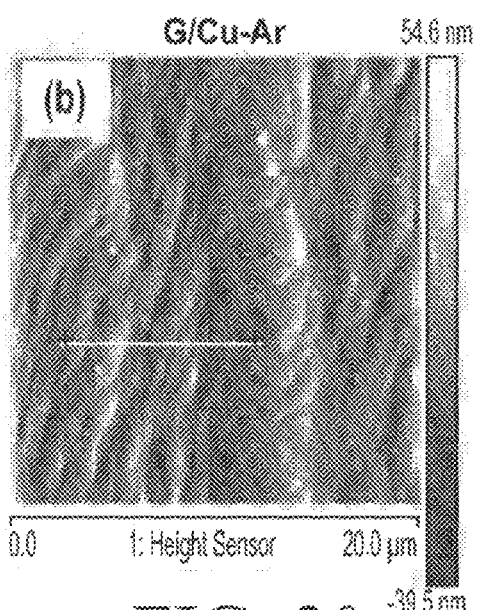
FIG. 20 is an atomic force micrograph of a grown on a copper substrate pre-annealed under an argon atmosphere.
Figure 21:
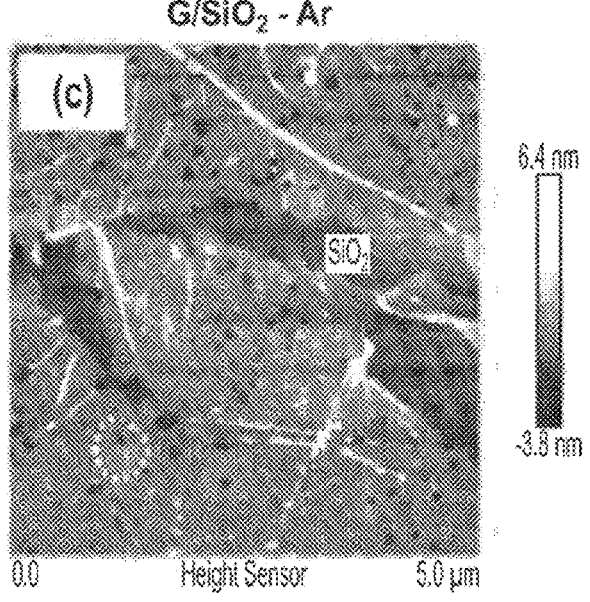
FIG. 21 is an atomic force micrograph of graphene grown on a substrate pre-annealed under an argon atmosphere and transferred to a $SiO_2$ substrate.
Figures 22, 23, 24:
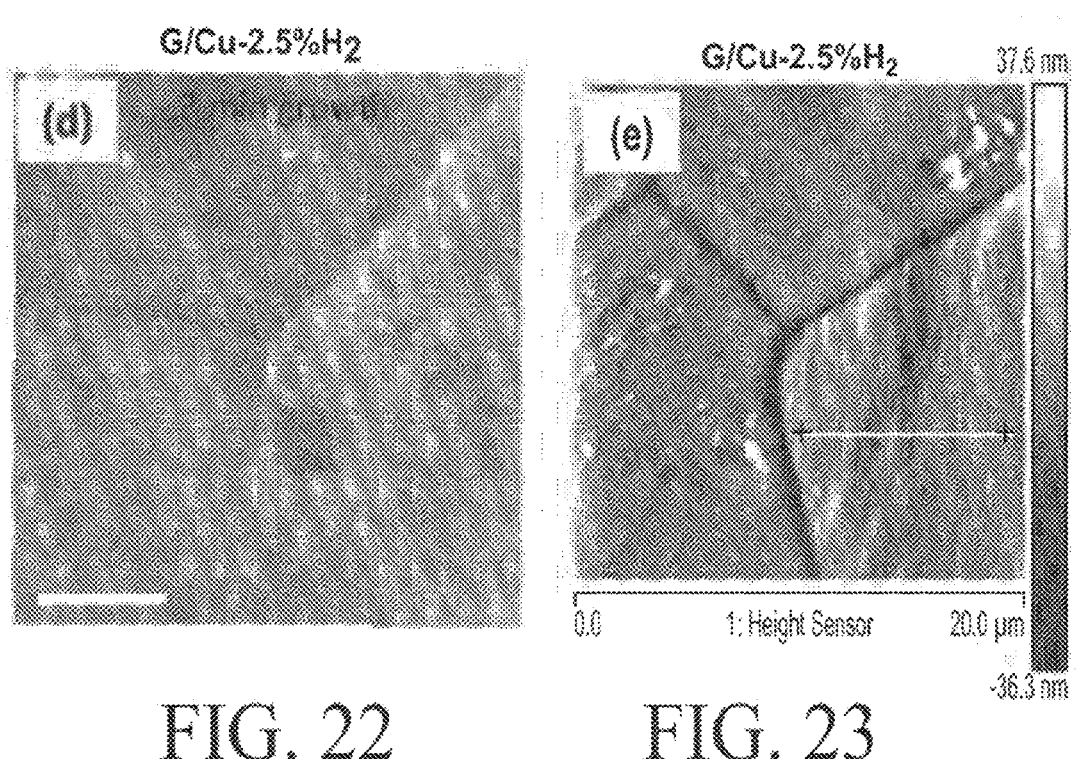
FIG. 22 is a scanning electron micrograph of graphene grown on a copper substrate pre-annealed under an argon and 2.5% $H_2$ atmosphere.
FIG. 23 is an atomic force micrograph of a grown on a copper substrate pre-annealed under an argon and 2.5% $H_2$ atmosphere.
FIG. 24 is an atomic force micrograph of graphene grown on a substrate pre-annealed under an argon and 2.5% $H_2$ atmosphere and transferred to a $SiO_2$ substrate.
Figures 25, 26:
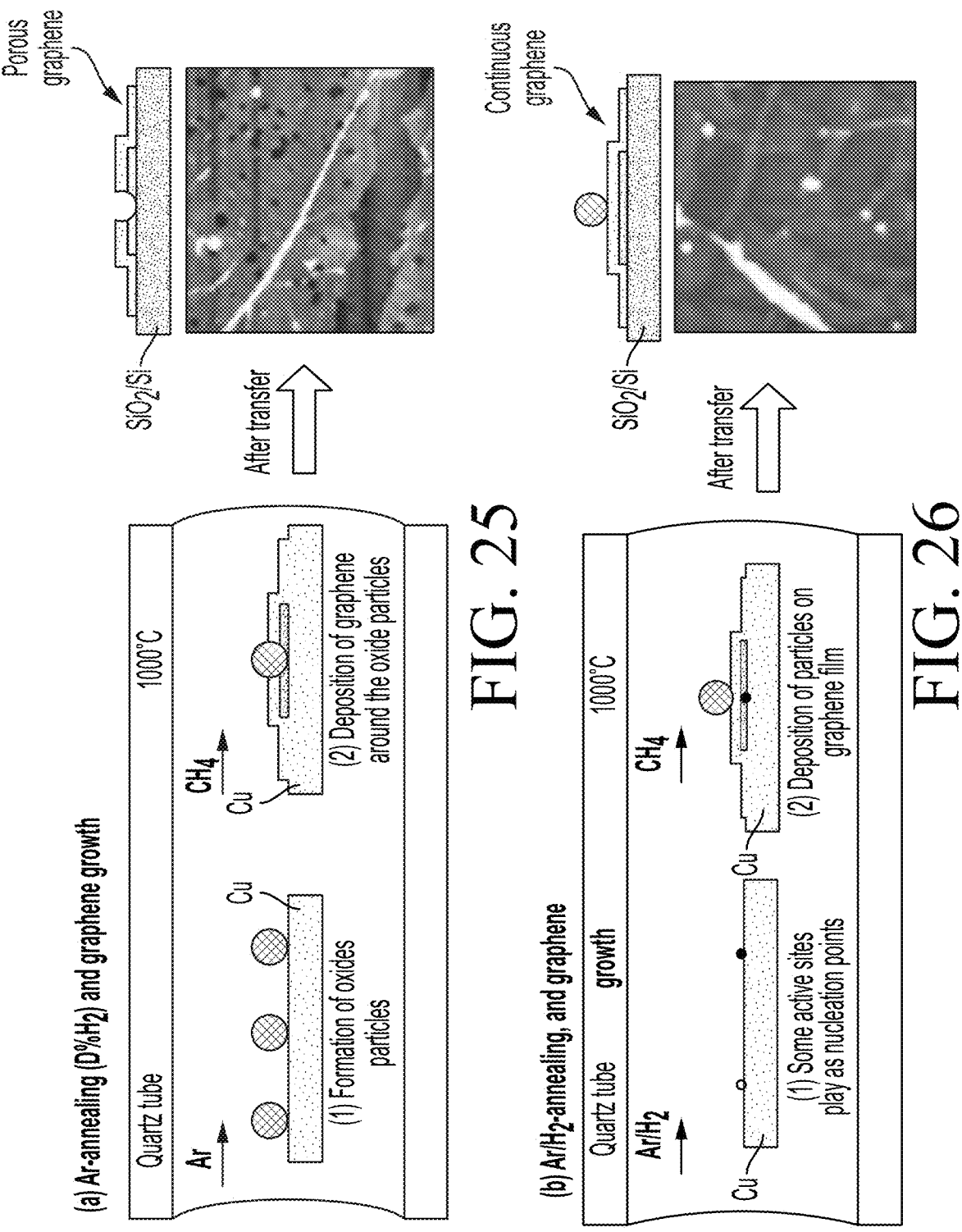
FIG. 25 is a schematic representation of the formation process of porous graphene layer under an argon atmosphere.
FIG. 26 is a schematic representation of the formation process of continuous graphene layer under an argon and hydrogen atmosphere.

In a CVD process used for forming the samples tested herein, a polycrystalline Cu foil substrate was first heated from room temperature (25° C.) to high temperature (~1000° C.) in the presence of hydrogen ($H_2$) and argon (Ar)

gas mixture ($H_2$ makes up 2.5 mol % of the total mixture) to avoid oxidizing the Cu surface by the trace amounts of oxygen in the Ar gas. Post heating, the foil was annealed for 30 minutes in Ar gas only where residual oxygen in the Ar gas partially oxidized the Cu surface and facilitated formation of oxide nanoparticles or islands thereon. These nanoparticles are formed on the top surface of the Cu substrate as indicated by circular white spots shown in FIGS. 12 and 13. The islands exhibit surface heights in the range from 12 to 44 nm, see FIG. 14. Impurities in the Cu foil and the quartz tube are other likely sources of nanoparticles. When methane ($CH_4$) was introduced for 5 min in the presence of low $H_2$ concentration (2.5 mol % of the total gas mixture) to the CVD-chamber, graphene nucleation and growth started and continued until the entire Cu surface was covered, see FIGS. 15 and 16. As shown in the figures, the graphene formed discontinuously around the noted islands, which had surface heights in the range between 9 and 50 nm, see FIG. 17. As a result, when the graphene was transferred onto another insulating substrate, the particles were removed, leaving behind uniformly distributed nanometer sized pores in the graphene film, see FIG. 18. When the growth time was shortened from 5 to 3 min, it was observed that the pores formed at increased density (~$4.5 \times 10^8$ cm$^2$) and became smaller in size (~90 nm diameters on average) as shown in FIGS. 19-21. Without wishing to be bound by theory, the shorter growth time (with the presence of $H_2$) appears to have not provided enough time for the surface Cu oxide particles to be etched, which led to an increased density of holes and smaller pore sizes. When $H_2$ was introduced to the system during annealing (with 2.5 mol % of the total gas mixture), neither oxide particles nor pores nor holes were detected either on the Cu substrate or on the deposited graphene film as confirmed by scanning electron microscope and AFM images shown in FIGS. 22-24. The formation mechanism of the observed pores after graphene transfer are exhibited by FIGS. 25-26. Specifically, annealing the Cu substrate in a pure Ar atmosphere (with trace oxygen) led to formation of large size surface oxides in the form of a plurality of islands distributed across a surface of the substrate, which in turn hindered the growth of graphene film underneath resulting in the formation of a porous atomically thin layer of graphene thereon (FIG. 25). However, when the Cu was annealed in an Ar/$H_2$ atmosphere (including 2.5 mol % $H_2$) oxide formation was suppressed due to the reduction effect of the $H_2$ gas relative to copper oxide and hence graphene achieved complete coverage on the Cu surface. After graphene growth, some particles (such as Si or other impurities in the quartz tube) may have nucleated and grown above this graphene layer at the graphene nucleation points (FIG. 26). This porous graphene film can have potential applications in gas separation and water purification.

Figure 27:
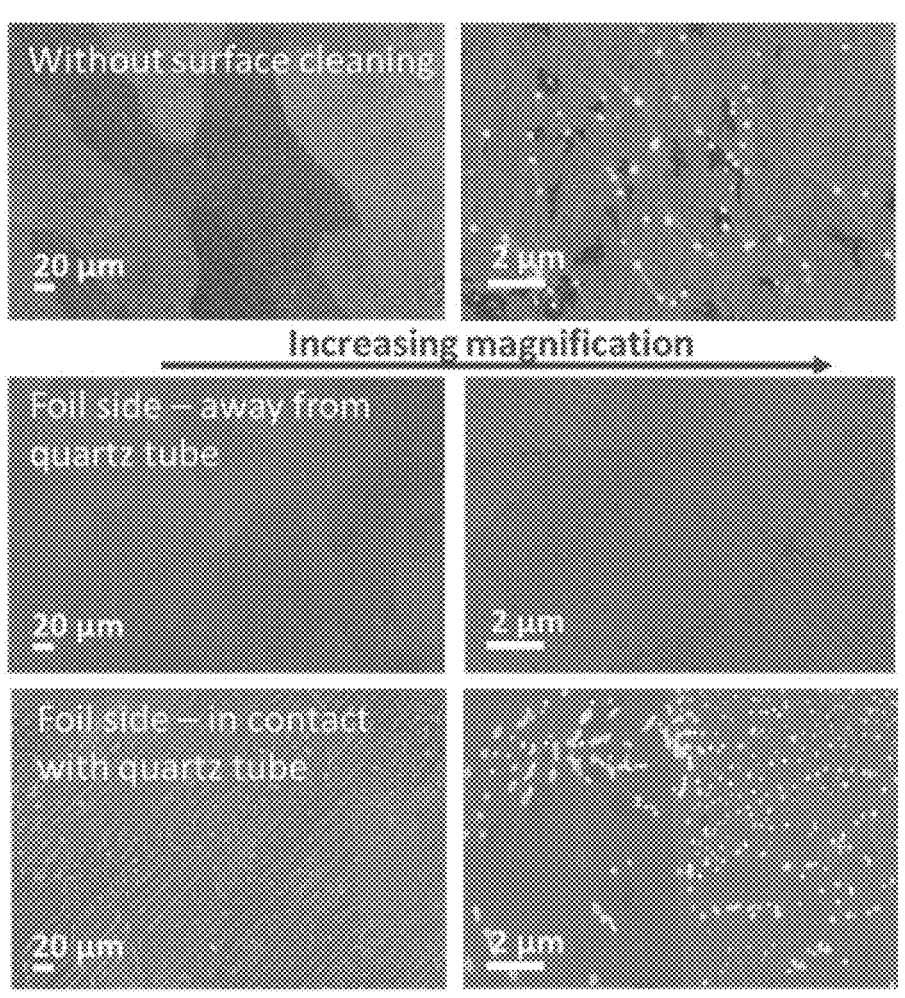
FIG. 27 are a series of scanning electron micrographs of oxide particles and silica particles present on a graphene layer grown on a copper foil without precleaning.

In addition to testing on annealed and surface treated substrates, another method for creating pores in an atomically thin layer growing on a substrate may involve not pre-cleaning the oxidized Cu foil surface after storage in air (FIG. 27). As seen in the scanning electron micrographs, the unclaimed substrate surface includes oxide particle on the surface of the Cu that may again be used to form pores in the graphene. Additionally, the Cu foil side contacting the quartz tube may form silica nanoparticles on the surface as well, providing an alternate method to form pores in graphene and other atomically thin materials as well.

These results can be extrapolated to similar processes using other catalytic substrates such as nickel, or other precursor gases that are reported in literature to synthesize graphene, a hexagonal boron nitride (hBN), molybdenum disulfide ($MoS_2$), and other atomically thin materials. A procedure may be followed which allows some oxidation of the catalytic substrate used in CVD, which then forms particles on the substrate, leading to pores in the synthesized atomically thin materials. Since the particles occlude the catalytic surface on which the material is synthesized, this process lends itself to fabrication of pores in multi-layer graphene or other multi-layer materials synthesized by CVD.

Example: Single Process Atomically Thin Layer Deposition and Pore Formation

This example describes the formation of pores in atomically thin materials by creating defects and/or pores in the atomically thin material during the growth process. These defects and/or pores may be further etched after growth has been completed. Here, the atmosphere and temperature of graphene synthesis is controlled in order to create pores in graphene either during or after synthesis by selective etching of defects in the graphene while the material is still in the CVD reactor. A reduction of the CVD process temperature is shown to offer a direct in-situ route to synthesize nanopores in monolayer graphene without the need for any post processing.

Nanopores may be created by etching as-formed graphene by i) changing the ratio of the growth precursor $CH_4$ and etchant $H_2$, or ii) by introducing trace etchants such as $H_2$ or $H_2O$ at ppm levels either during synthesis or post synthesis during cooling. The defects induced in graphene during lower-temperature CVD synthesis can be enlarged during the cooling process in the presence of an atmosphere that selectively etches the defects relative to pristine portions of the pressing. The pore defect density increases when synthesis temperature is lower or when more etchant ($H_2$ or $H_2O$) is present during synthesis, and that pore size increases with longer exposure to etching environments during the cooling phase where barrier to defect nucleation is higher.

Figure 28:
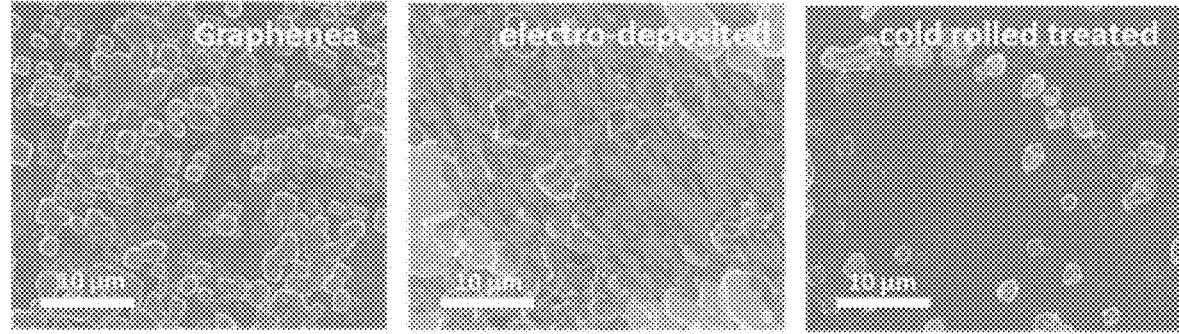
FIG. 28 is a comparison of scanning electron micrographs of commercially available graphene, graphene grown by chemical vapor deposition on an electrodeposited foil, and graphene grown by chemical vapor deposition on a cold-rolled foil.
Figures 29A, 29B, 29C:
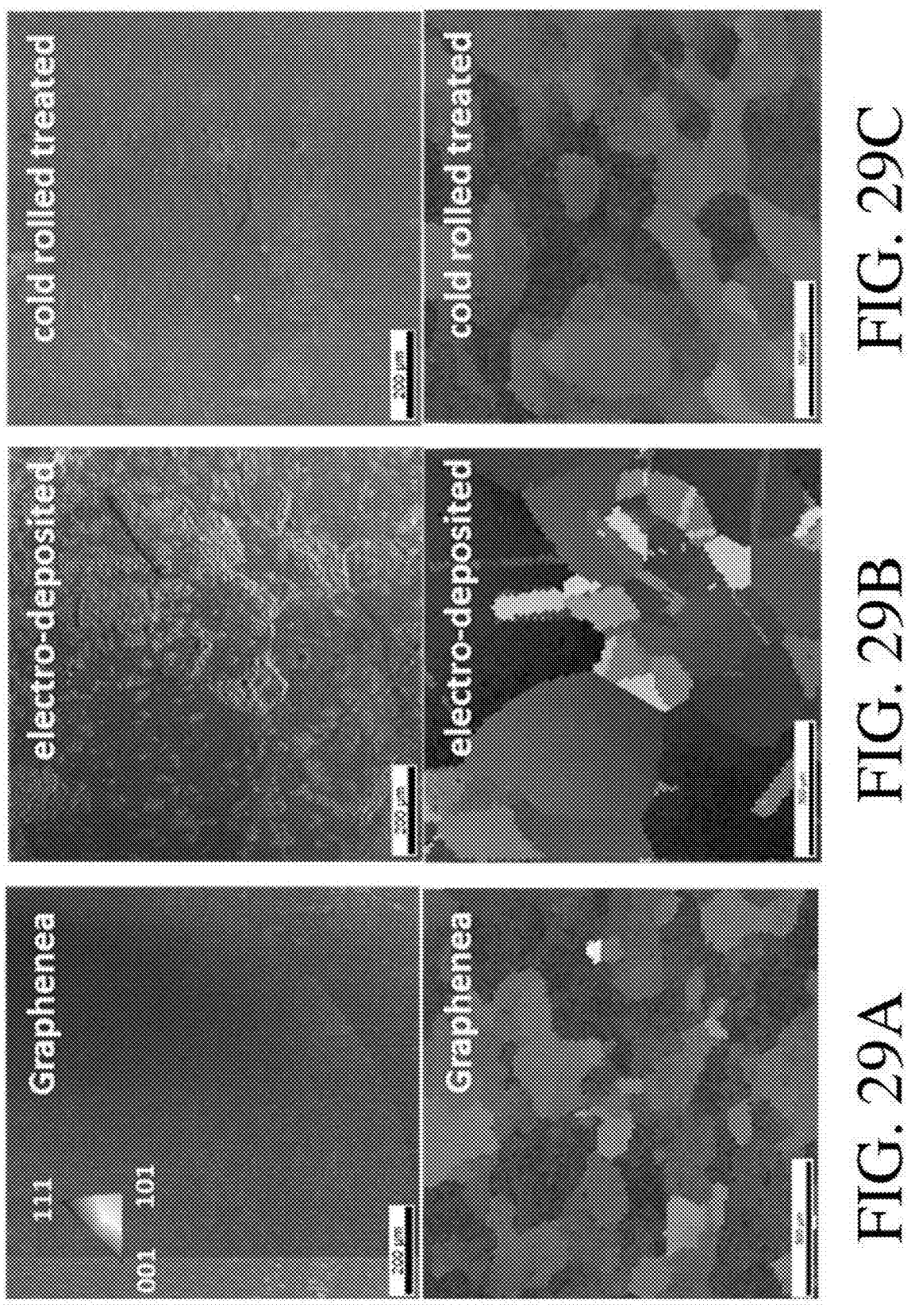
FIG. 29A is a comparison of etch testing and copper crystal grain orientation for commercially available graphene disposed on a copper substrate.
FIG. 29B is a comparison of etch testing and copper crystal grain orientation for graphene grown by chemical vapor deposition on an electrodeposited foil.
FIG. 29C is a comparison of etch testing and copper crystal grain orientation for graphene grown by chemical vapor deposition on a cold-rolled foil.

Parameters that influence quality of graphene during synthesis by chemical vapor deposition (CVD) on copper foil were also investigated. Specifically, as shown in FIG. 28 to characterize defects in commercially available graphene as well as graphene formed on electrodeposited copper foil and cold rolled treated copper foil, etch tests were performed by exposing the graphene-on-copper to ammonium persulfate, a copper etchant. As shown in FIGS. 29A-29C, any defects in the graphene layers allowed the underlying copper to be etched, providing a simple and robust method to assess defects in graphene. Electron back-scattered diffraction (EBSD) shows that defects in graphene tended to be greatly exacerbated when the copper grains were oriented at awkward angles with respect to the surface of the copper foil such that none of the primary crystal facets are aligned to the surface. hence substrate engineering offers another method to create defects in graphene.

Example: Selective Transport Through Graphene

This example describes the synthesis of graphene and its use as a selective filter.

Graphene was synthesized using chemical vapor deposition. Copper foil (JX Holding HA) was loaded into a quartz tube split furnace and heated in 60 sccm $H_2$ at a pressure of ~0.5-1 Torr (system base pressure ~60-90 mTorr) to 1050° C. and then annealed for 60 min at this temperature. Next, the copper foil was cooled to the growth temperature (850° C.-1050° C.) over the course of 15 minutes. 3.5 sccm $CH_4$ was then introduced to the furnace. After 30 minutes, the amount of $H_2$ in the furnace was further increased to 7 sccm. This gas composition was kept constant for 30 minutes. After the reaction was completed, the foil was quench cooled to room temperature by opening the split furnace and using an air fan. Graphene was then transferred to polycarbonate track etched membranes using a dry transfer method. The graphene was also exposed to an ammonium persurfate solution for 40 min to 240 min to etch the copper. Diffusion measurements were performed by sandwiching the graphene covered polycarbonate track etched membrane.

Figure 30:
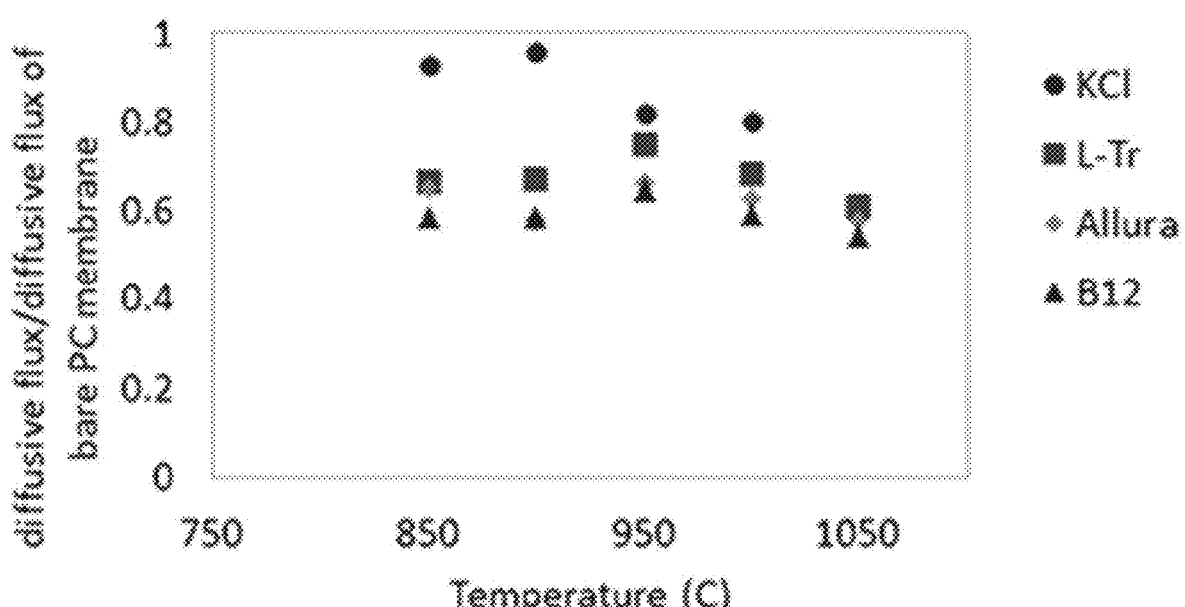
FIG. 30 is a chart showing the diffusive flux of selected species through graphene synthesized at various temperatures supported by a polycarbonate membrane.

As shown in FIG. 30, for graphene membranes synthesized at 1050° C. no selective transport is seen and all species transport occurs due to flow from large tears in the graphene membrane. However, upon decreasing the graphene synthesis temperature to 1000° C., increased transport of KCl was observed. This may be attributable to sub nanometer defects that form during synthesis the of graphene at this lower temperature. As the synthesis temperature was further decreased to 900° C., transport was enhanced. Such membranes with intrinsic sub nanometer porosity may be useful for dialysis based separation i.e. they allow for selective transport of sub-nanometer hydrated K+ and Cl– ions from KCl but not small molecules such as L-Tryptophan, Vitamin B12 and Allura red dye. Transport rates may be as high as 2 orders of magnitude faster than conventional dialysis membranes.

Example: Nanoporous Single Layer Graphene Grown at Different Temperatures

Chemical Vapor Deposition (CVD) was used to directly synthesize nanoporous graphene on an underlying copper foil at different temperatures for use as a nanoporous atomically thin material (NATM). Specifically, graphene growth was performed in a hot-walled tube furnace using copper foil (purity 99.9%, thickness 18 μm, JX Holding HA) that was cleaned by sonicating in 15% $HNO_3$ to remove oxides and other contaminants from the surface. The copper foil was subsequently washed with deionized water and dried in nitrogen before being annealed at 1050° C. for 60 min in 60 sccm $H_2$ at ~1.14 Torr. After annealing the foil was cooled to the different growth temperatures in 15 min and graphene growth was performed by adding $CH_4$ (3.5 sccm ~2.7 Torr) to $H_2$ at temperatures ranging from 850° C.-1050° C. for 30 min followed by 30 min of 7 sccm $CH_4$ (~3.6 Torr) and 60 sccm $H_2$. The foil was then rapidly cooled in the growth atmosphere at the end of the graphene growth.

Figure 31A:
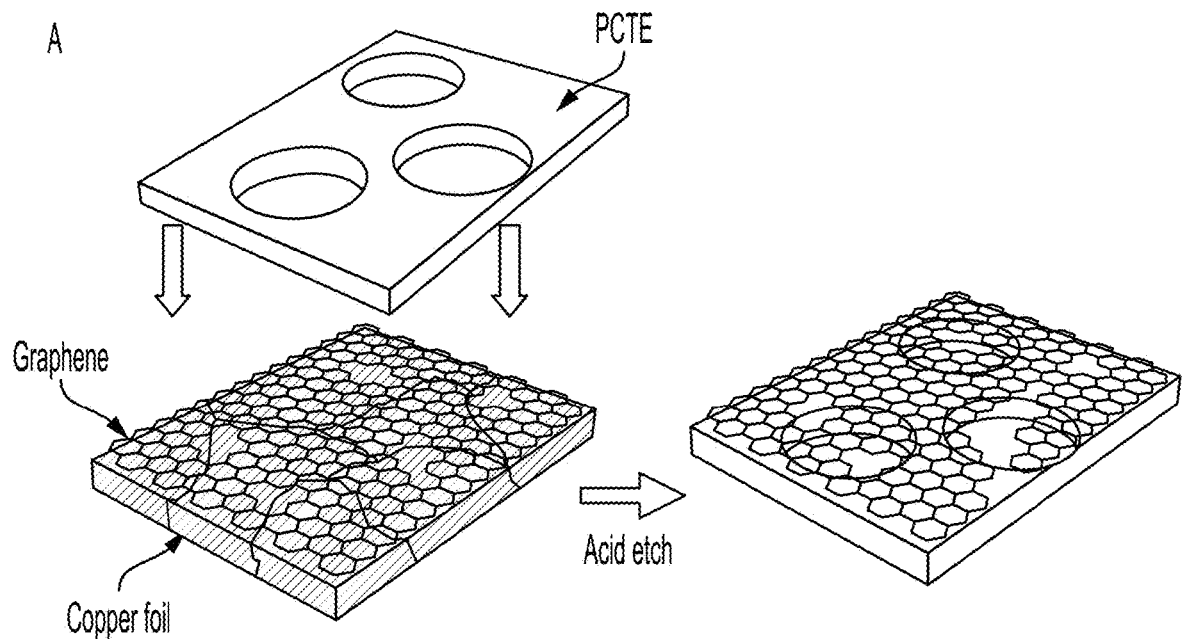
FIG. 31A is a schematic showing graphene transfer to a polycarbonate track etched support.

After graphene growth, the graphene was transferred onto a supporting porous substrate. Specifically, the graphene and copper foil stack was subjected to a pre-etch in ammonium persulfate (APS-100, Transene) for 5 min to remove the graphene on Cu foil surface in contact with the quartz tube on which it was originally deposited. Then, as illustrated in FIG. 31A, a polymer-free transfer process was used where a polycarbonate track etched (PCTE) support was mechanically contacted with the graphene layer disposed on top of the copper foil. The PCTE, obtained from Sterlitech Inc., had approximately 10% porosity, was non-PVP coated, was hydrophobic, and had approximately 200 nm diameter cylindrical pores. The PCTE, graphene and Cu foil stack was then etched in APS-100 to remove the copper foil. The graphene and PCTE stack was then rinsed with deionized water followed by an ethanol rinse and dried at room temperature.

Figure 31B:
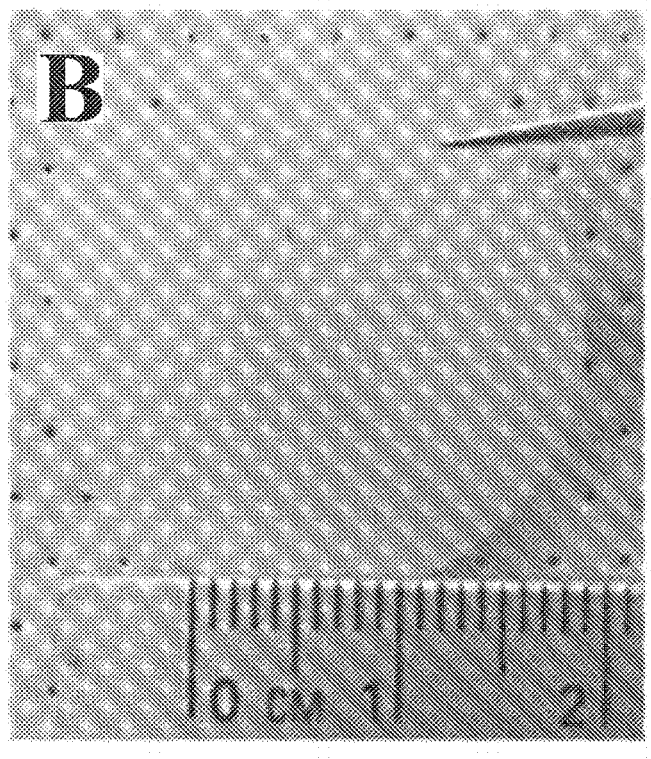
FIGS. 31B-31E are micrographs of graphene on a polycarbonate trach etched support.
Figure 31C:
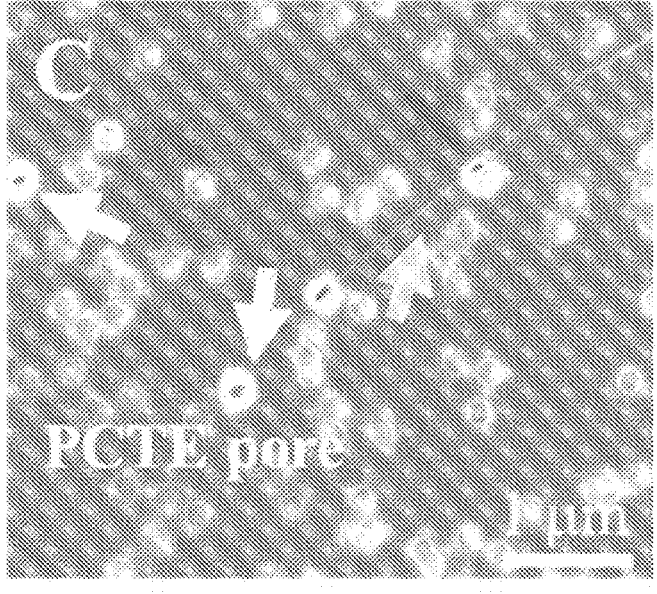
Figure 31D:
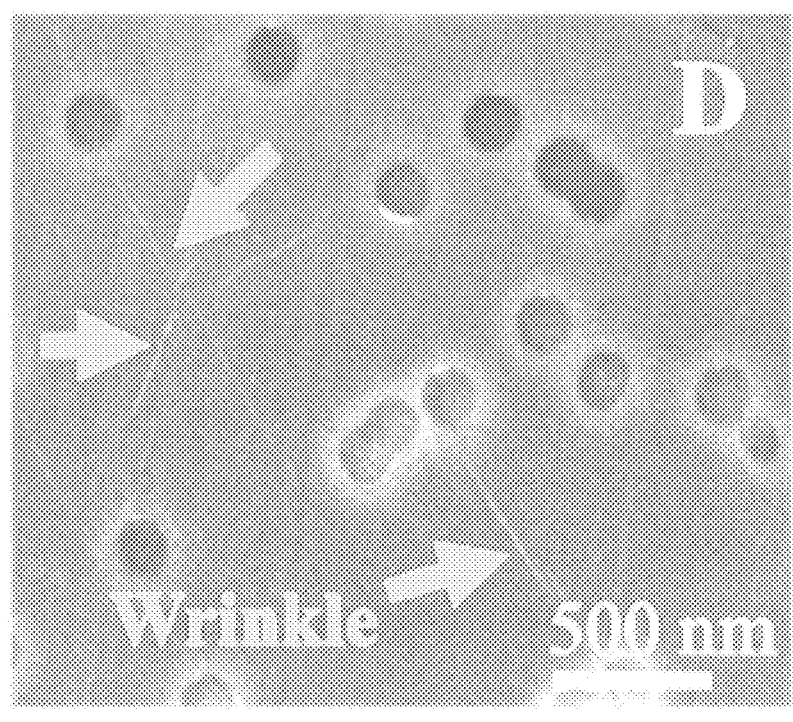
Figure 31E:
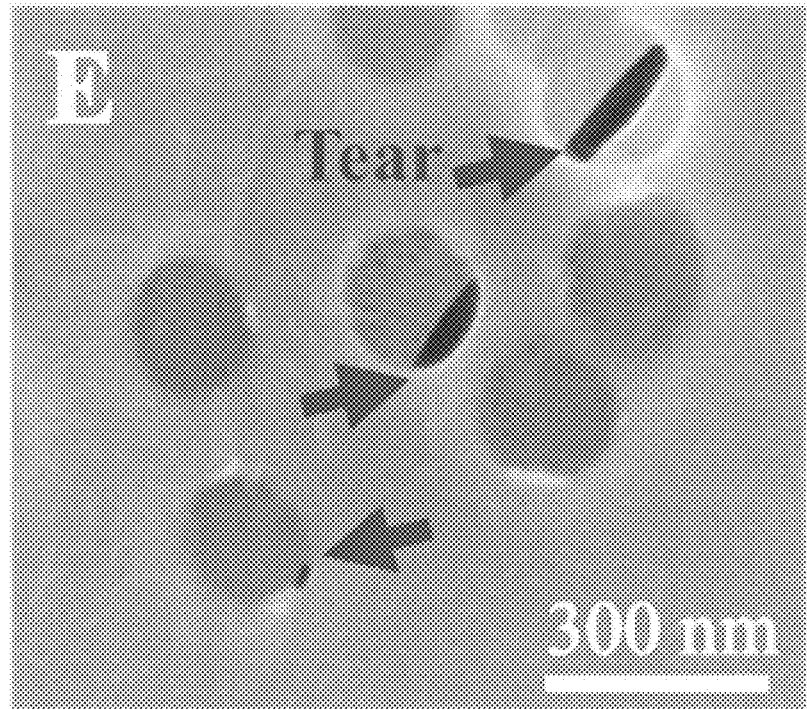

Successful graphene transfer onto a PCTE substrate was confirmed using optical imaging as shown in FIG. 31B where the darker square located within the interior of the PCTE substrate corresponds to graphene on the PCTE and the white surrounding region is the bare PCTE support. Scanning electron microscopy (SEM) images shown in FIGS. 31C-31E further confirm the presence of graphene on PCTE. In FIG. 31C the graphene covered PCTE pores (about 200 nm diameter dark circular features) appear darker due to the electrical conductivity of graphene and the un-covered PCTE pores appear brighter. Large tears and other damage inevitably introduced during the mechanical pressing stage of transfer are also shown in FIGS. 31C and 31E and wrinkles introduced in the graphene are shown in FIGS. 31C and 31D.

Example: Characterization of Graphene Grown at Different Temperatures

Figure 32A:
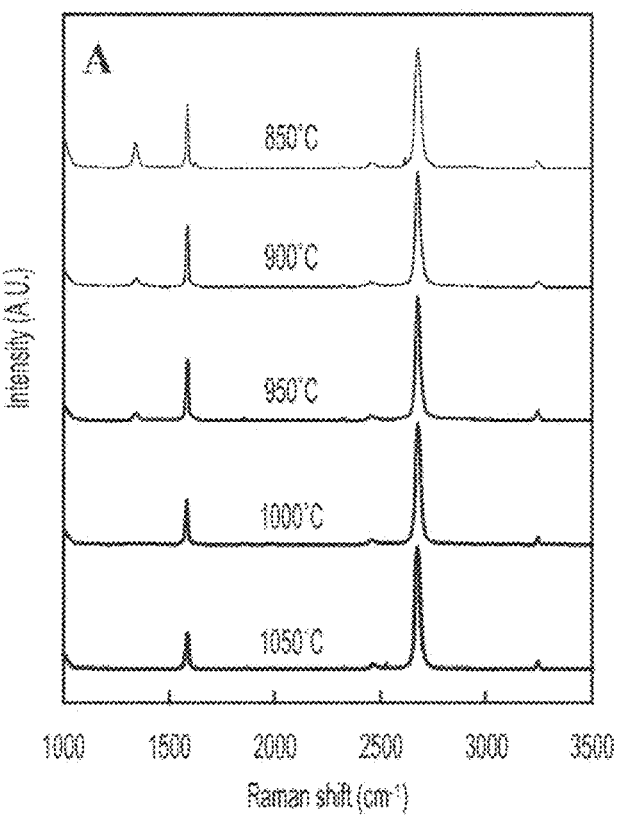
FIG. 32A is a chart showing Raman spectra for monolayer graphene synthesized at different temperatures by chemical vapor deposition.

Graphene samples grown at different temperatures according to the above described methods were characterized using Raman Spectroscopy. Specifically, FIG. 32A presents Raman spectra for CVD graphene samples synthesized at temperatures ranging from 850° C. to 1050° C. The Raman spectra were taken prior to any transport measurements to provide a qualitative measure of intrinsic defects in the hexagonal graphene lattice prior to use. As shown in the figure, the Raman spectra for CVD graphene synthesized at temperatures greater than 1000° C. look similar, with peaks corresponding to high quality graphene i.e. a 2D peak at about 2700 $cm^{-1}$, a G peak at about 1600 $cm^{-1}$, and a complete absence of the D peak at about 1350 $cm^{-1}$. However, a decrease in CVD processing temperature was accompanied by a clear and distinct increase in the D peak, particularly for temperatures less than or equal to 950° C. indicating the presence of defects and dangling bonds in the graphene lattice. Without wishing to be bound by theory, the controlled increase in the presence of defects, as indicated by the increasing D peak with decreasing temperature, confirms that it is possible to control the presence of defects within CVD grown graphene using the growth temperature.

Figure 32B:
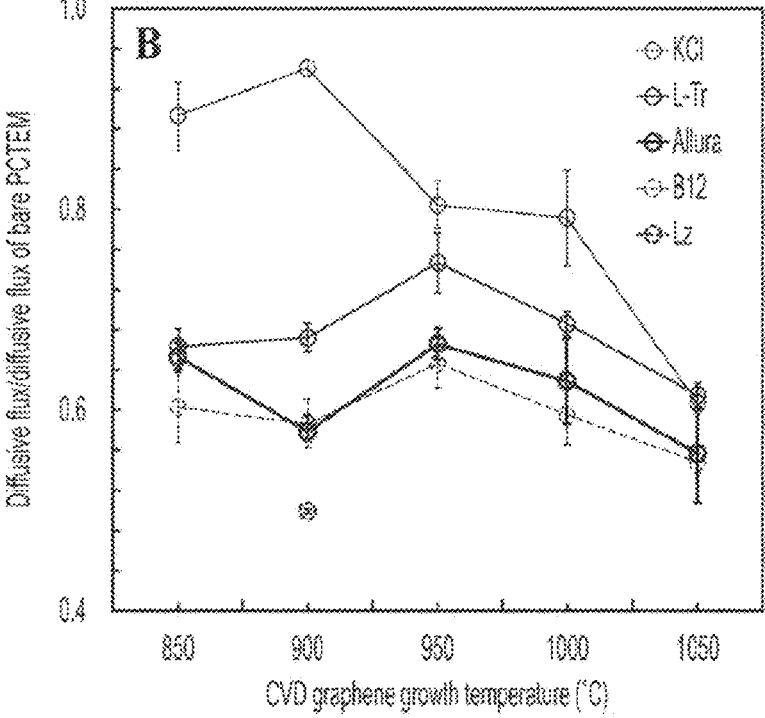
FIG. 32B is a chart showing diffusive transport across graphene on a polycarbonate track etched support normalized by transport across bare polycarbonate track etched support.

To assess the size and mass transport properties through the defects formed in the CVD graphene, diffusive flux across the graphene and PCTE stacks was measured and normalized with the diffusive flux across the bare PCTE support membrane, see FIG. 32B. Diffusive flux measurements across the graphene and PCTE stacks are presented for solutes such as KCl (a salt, hydrated $K^+$ and $Cl^-$ ions with effective diameters of about 0.66 nm), L-Tryptophan (an amino acid with an effective diameter of about 0.7-0.9 nm, 204 Da), Allura Red Dye (a food coloring dye with an effective diameters of about 1 nm, 496 Da), Vitamin B12 (a vitamin with an effective diameter of about 1-1.5 nm, 1355 Da), and Lysozyme (an egg protein with an effective diameter of about 3.8-4 nm, 14300 Da). Diffusion driven transport across the synthesized graphene and PCTE membranes could arise from i) non-selective transport through large tears in the graphene or ii) selective transport through nanopores in the graphene.

As shown in the figure, the normalized flux for graphene synthesized at 1050° C. was similar for all species. Without wishing to be bound by theory, this indicates the absence of nanometer and sub-nanometer sized defects and that transport occurs primarily through non-selective large tears in the graphene. A decrease in graphene CVD growth temperature however leads to selective transport such that the normalized flux of KCl was greater than the normalized flux of L-Tryptophan which was greater than the normalized flux of Allura Red which was greater than the normalized flux of Vitamin B12. Without wishing to be bound by theory, this suggests the presence of nanometer and sub-nanometer sized defects in addition to non-selective flow across large tears. Further, the graphene synthesized at 900° C. shows maximum separation between the normalized fluxes of KCl and L-Tryptophan, while the graphene synthesized at 850° C. shows similar trends albeit with slightly lower normalized flux difference between KCl and L-Tryptophan. Again without wishing to be bound by theory, such preferential transport of KCl compared to L-Tryptophan is indicative of the presence of sub-nanometer and nanometer sized defects that are less than or equal to 2 nm.

High resolution transmission electron microscopy (TEM) of graphene synthesized at 900° C. transferred to holey $Si_3N_4$ grids was conducted. The TEM images confirmed the presence of nanometer sized defects in the graphene lattice consistent with the above noted transport measurements and Raman spectra. The transfer process to rigid SiN grids used a poly methyl methacrylate (PMMA) carrier layer that was subsequently dissolved using acetone after transfer to the TEM grids. While there was polymer residue present on the imaged graphene, the TEM images confirmed the presence of nanometer sized defects and holes in the graphene surface.

Without wishing to be bound by theory, it is noted that the defects observed here could have formed during the different stages of the CVD process e.g. defects could form during growth a) directly within the individual domains that make up the continuous polycrystalline graphene film, b) due to incomplete merging of domain boundaries, c) via etching of defects formed during CVD growth or d) while cooling the graphene on Cu foil in the growth mixture, specifically at temperatures where the $CH_4$ can no longer dissociate to supply carbon but $H_2$ or other impurities can etch the synthesized graphene. Hence, in that sense, the defects may be specific to the synthesis conditions used and/or CVD system specific leakages of air and/or other contaminants. Further, the defects formed during CVD could also have been potentially enlarged by oxidation of Cu underneath the graphene during storage. However, graphene stored for about 15 days and about 1 year did not exhibit any major differences in from freshly synthesized graphene.

The above characterization of membrane stacks including graphene grown at different temperatures confirms that graphene CVD temperature control allows for in-situ pore creation in a graphene lattice in a scalable cost-effective manner over large areas (e.g. greater than about 5 $cm^2$) that offers the benefits of pore creation using a single-step bottom-up process which is in direct contrast to current top-down methods of pore creation where a separate pore creation step is conducted after graphene formation.

Example: Porous Supporting Substrate Formation on an Atomically Thin Active Layer Experiments regarding the manufacture and use of nanoporous graphene and polyether sulfone (PES) membranes were conducted. The experimental manufacture and characterization of these membranes is detailed further below.

Graphene growth was performed in a hot-walled tube furnace on copper foil (purity 99.9%, thickness 18 μm) that was cleaned by sonicating it in 15% $HNO_3$ to remove oxides and other contaminants from the surface. The copper foil was subsequently washed with deionized water and dried in nitrogen before being annealed at 1050° C. for 60 min in 60 sccm $H_2$ at ~1.14 Torr. After annealing the foil was cooled to growth temperature in 15 min and graphene growth was performed by adding $CH_4$ (3.5 sccm ~2.7 Torr) to $H_2$ at 800-1050° C. for 30 min followed by 30 min of 7 sccm $CH_4$ (~3.6 Torr) and 60 sccm $H_2$. The foil was rapidly cooled in the growth atmosphere at the end of the growth.

Casting polymer solution was prepared by mixing 16 wt % polyether sulfone (PES) resin 82 wt % N-Methyl-2-pyrrolidone and 2 wt % isopropanol (IPA), and baked in an oven at 75° C. for ~24 hours and subsequently allowed to cool and de-gas for about 12 hours. The casting was performed after adhering the copper foil including a graphene layer with an area greater than 5 cm² (pre-etched in ammonium persulfate (APS) for 5 min to remove the graphene on the back side) onto an aluminum plate with Scotch tape (magic tape 810 19 mm width, about 50 μm thickness). A disposable culture tube (diameter 13 mm, height 100 mm) with 3 windings of Scotch tape was used to spread the PES solution on graphene on copper in one, swift unidirectional stroke. The PES, graphene, and copper foil stack was then immersed in a de-ionized water bath for 30 min to undergo phase inversion after which the stack was released from the aluminum plate and the Cu foil was etched in APS to leave graphene suspended on a hierarchically porous PES support. The resulting stack of graphene and porous PES substrate was rinsed with deionized water followed by ethanol and dried at room temperature.

Figures 33B, 33C:
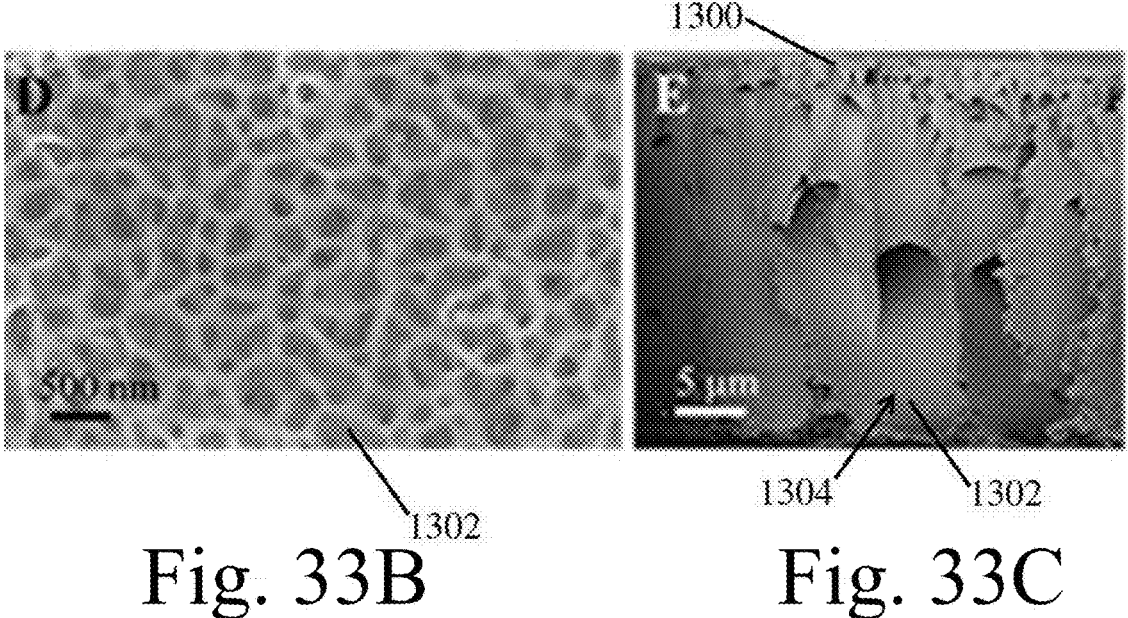
FIGS. 33B and 33C are scanning electron micrographs of a porous PES substrate formed on an atomically thin active layer.

FIGS. 33B and 33C are scanning electron micrographs of the formed stack of graphene and PES. FIG. 33B specifically shows a graphene layer disposed on top of the PES porous substrate with the PES porous substrate visible through the graphene. FIG. 33C presents a cross section of the stack of graphene and PES with graphene located at the top of the image. As shown in the figure, the PES substrate exhibits a hierarchical pore structure with pores having diameters of about 200-500 nm located in a layer adjacent to the graphene which are connected to much larger elongated pores that have widths on the order of several micrometers extending to the side of the PES substrate opposite the graphene layer. As also shown in the figure, the pore structure also includes micro and nano pores that connect laterally throughout the PES substrate. Such a pore structure may facilitate the divergent demands of low resistance to diffusion-driven transport while simultaneously supporting nanoporous graphene effectively using a simple membrane manufacturing process.

The permeance and selectivity of the above described membranes including a PES substrate were evaluated using diffusion driven flow for solutes such as KCl, L-Tryptophan, Vitamin B12 and Lysozyme (Lz). The performance of the above detailed membranes was compared with commercially available state-of-the-art conventional polymeric dialysis membranes (0.1-0.5 kDa, 0.5-1 kDa, 3.5-5 kDa, 8-10 kDa). During testing, the membranes were sandwiched between two side-by-side diffusion cells (Permegear Inc., 5 mm orifice, 7 mL volume) for diffusion driven flow measurements. All measurements were performed in triplicate.

Figure 34:
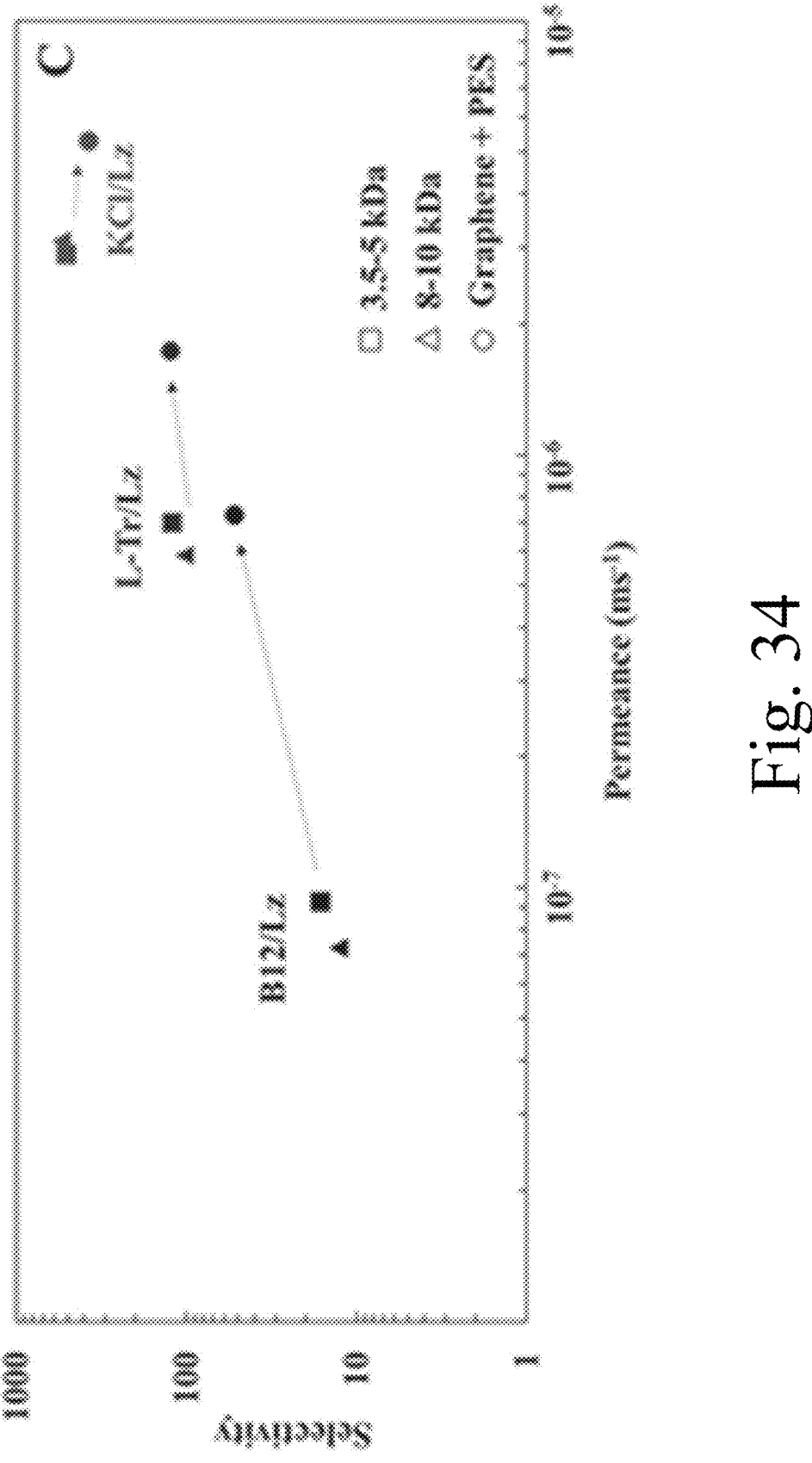
FIG. 34 is a graph of measured selectivity vs. permeance for a membrane including graphene and a PES substrate as compared to different commercial membranes.

FIG. 34 depicts selectivity vs permence for KCl vs Lysozyme, L-Tryptophan vs Lysozyme, and Vitamin B12 vs Lysozyme for the graphene and PES stack (circles) as well as commercial dialysis membranes for 3.5-5 kDa (square) and 8-10 kDa (triangles). The graphene and PES stacks show distinctly higher permeance on the order of about a 2 to 100 times increase compared to the conventional membranes along with better, or at the very least, comparable selectivity. It should be noted that, the upper bound of a 100 times permeance increase was computed by comparing KCl permeance for the graphene and PES stack of about 5.27× $10^{-6}$ ms$^{-1}$ to the permeance of a 0.5-1 kDa commercial membrane of about 5.40×$10^{-8}$ ms$^{-1}$ as well as comparing Vitamin B12 permeance for the graphene and PES stack of about 7.25×$10^{-7}$ ms$^{-1}$ to the permeance of a 0.5-1 kDa commercial membrane of about 6.47×$10^{-9}$ ms$^{-1}$ respectively.

To confirm that the observed performance was due to the presence of the nanoporous graphene active layer, a graphene and PES membrane stack was subjected to 5 min of air plasma to effectively destroy the graphene. The permeance and selectivity measurements for the graphene and PES stack after air plasma damage resulted in the stack exhibiting an increase of more than 1.5 orders of magnitude in Lysozyme permeance. This increase in Lysozyme permeance confirmed that it was the nanoporous graphene, not the PES supporting substrate, that provided the observed size-selective transport of the synthesized membranes. Interestingly, the permeance of the salt and small molecules did not change significantly after the stack was exposed to the 5 min of plasma treatment. Without wishing to be bound by theory, this indicates that the nanoporous graphene is essentially transparent for all species except lysozyme, and that the permeance is governed by the porous PES substrate. Therefore, further improvements are expected with thinner supporting substrate layers.

The above experiments confirm that the evaluated nanoporous graphene and PES stacks offer significant improvements over the conventional polymeric membranes with higher permeance and roughly equivalent or better selectivity for the tested salts and compounds with the added benefit of reduced handling, and corresponding damage, as compared to processes where the graphen is transferred to a separately formed substrate. As used herein, "positioned in functional relationship" will be understood by those of ordinary skill in the art to define a situation where at least one object is positioned relative to at least one other object such that the function, i.e., property of filtration and/or separation, of one of the objects is affected by the other object. Two or more objects can be positioned in functional relationship with each other by, for example, one being disposed upon the other (i.e., physically in contact with the other), or the like. Objects can be maintained in functional relationship with each other (e.g., maintained in a relationship where one is disposed upon the other), by bonding, clamping, being held together in a common apparatus effectively immobilizing one with respect to the other, or the like. Bonding and other similar techniques are known to those of ordinary skill in the art. It is to be understood that wherever language such as "disposed upon," "bonded to," or the like is used, the objects that are subject to that description can be positioned in functional relationship with each other in other ways as well. Objects positioned in functional relationship with each other need not be positioned directly adjacent to each other but can be separated by void space and/or other intermediate objects that might or might not affect the function of the resulting device.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:
1. An article comprising:
a substrate comprising a first material;

a plurality of islands formed on the substrate, wherein the plurality of islands comprises a second material that is a product of the first material; and an atomically thin layer disposed on a portion of the substrate comprising the first material, wherein the plurality of islands extend past the atomically thin layer in a direction directed away from the substrate.

2. The article of claim 1, further comprising a polyether sulfone (PES) supporting substrate.

3. The article of claim 1, wherein the plurality of islands comprise at least one selected from the group of an oxide and a carbide of the first material.

4. The article of claim 1, wherein the plurality of islands have an average height of greater than or equal to 5 nm and less than or equal to 1 micron.

5. The article of claim 1, wherein the plurality of islands have an average diameter of greater than or equal to 5 nm and less than or equal to 1 micron.

6. The article of claim 1, wherein a density of the plurality of islands is greater than or equal to 1 per square micron and less than or equal to 1000 per square micron.

7. The article of claim 1, wherein the substrate comprises at least one selected from the group of copper, nickel, cobalt, platinum, iron, gold, silver, germanium, ruthenium, iridium, rhenium, rhodium, a transition metal catalyst, and their alloys.

8. The article of claim 1, wherein the atomically thin layer comprises at least one selected from the group of graphene, hexagonal boron nitride, molybdenum sulfide, vanadium pentoxide, silicon, doped-graphene, graphene oxide, hydrogenated graphene, fluorinated graphene, covalent organic frameworks, layered transition metal dichalcogenides, layered Group-IV and Group-III metal chalcogenides, silicene, germanene, and layered binary compounds of Group IV elements and Group III-V elements.

9. The article of claim 1, wherein the atomically thin layer includes one or more adjacent crystal planes extending parallel to a face of the atomically thin layer.

10. The article of claim 9, wherein the atomically thin layer includes less than or equal to 10 adjacent crystal planes extending parallel to a face of the atomically thin layer.

11. The article of claim 9, wherein the atomically thin layer includes less than or equal to 5 adjacent crystal planes extending parallel to a face of the atomically thin layer.

12. The article of claim 1, wherein a thickness of the atomically thin layer is between or equal to 0.1 nm and 10 nm.

13. The article of claim 1, wherein a thickness of the atomically thin layer is between or equal to 0.3 nm and 5 nm.

14. The article of claim 1, wherein the plurality of islands extend through the atomically thin layer in a direction directed away from the substrate.

15. The article of claim 1, wherein the plurality of islands extend through and past the atomically thin layer in a direction directed away from the substrate.

* * * * *